United States Patent
Koyanagi

(10) Patent No.: US 6,657,567 B2
(45) Date of Patent: Dec. 2, 2003

(54) COMPRESSING METHOD AND DEVICE, DECOMPRESSION METHOD AND DEVICE, COMPRESSION/DECOMPRESSION SYSTEM, AND RECORDED MEDIUM

(75) Inventor: Yukio Koyanagi, Saitama (JP)

(73) Assignee: Yasue Sakai, Nakao (JP)

( * ) Notice: Subject to any disclaimer, the term of this patent is extended or adjusted under 35 U.S.C. 154(b) by 179 days.

(21) Appl. No.: 10/018,096

(22) PCT Filed: Apr. 10, 2001

(86) PCT No.: PCT/JP01/03078

§ 371 (c)(1),
(2), (4) Date: Dec. 14, 2001

(87) PCT Pub. No.: WO01/80430

PCT Pub. Date: Oct. 25, 2001

(65) Prior Publication Data

US 2003/0071746 A1 Apr. 17, 2003

(30) Foreign Application Priority Data

Apr. 14, 2000 (JP) .................................... 2000-114270

(51) Int. Cl.[7] .............................................. H03M 7/00
(52) U.S. Cl. .................................................... 341/60
(58) Field of Search ............................ 341/50, 51, 87, 341/65, 67, 106, 107, 60

(56) References Cited

U.S. PATENT DOCUMENTS 5,933,104 A * 8/1999 Kimura ..................... 341/87

FOREIGN PATENT DOCUMENTS

| JP | 59-096513 A | 6/1984 |
| JP | 3-192400 A | 8/1991 |
| JP | 4-061509 A | 2/1992 |
| JP | 10-126275 | 5/1998 |

* cited by examiner

Primary Examiner—Brian Young
(74) Attorney, Agent, or Firm—Connolly Bove Lodge & Hutz LLP

(57) ABSTRACT

There are provided: an offset adding section 3 for converting signed digital data to unsigned digital data by adding an offset value to signed digital data to be compressed, a rounding section 5 for reducing the number of bits per word by performing a rounding operation of a lower-order bit on the unsigned digital data, a timing synthesizer 6 and a compressing section 7 for sampling the digital data undergoing a rounding operation at a time interval of a point where a differential value varies in polarity and for obtaining as compressed data a pair of a discrete amplitude data value on each sample point and a timing data value indicative of a time interval between sample points. When a signal is compressed and expanded on a time base, the operation can be performed on the time base without frequency conversion.

27 Claims, 15 Drawing Sheets

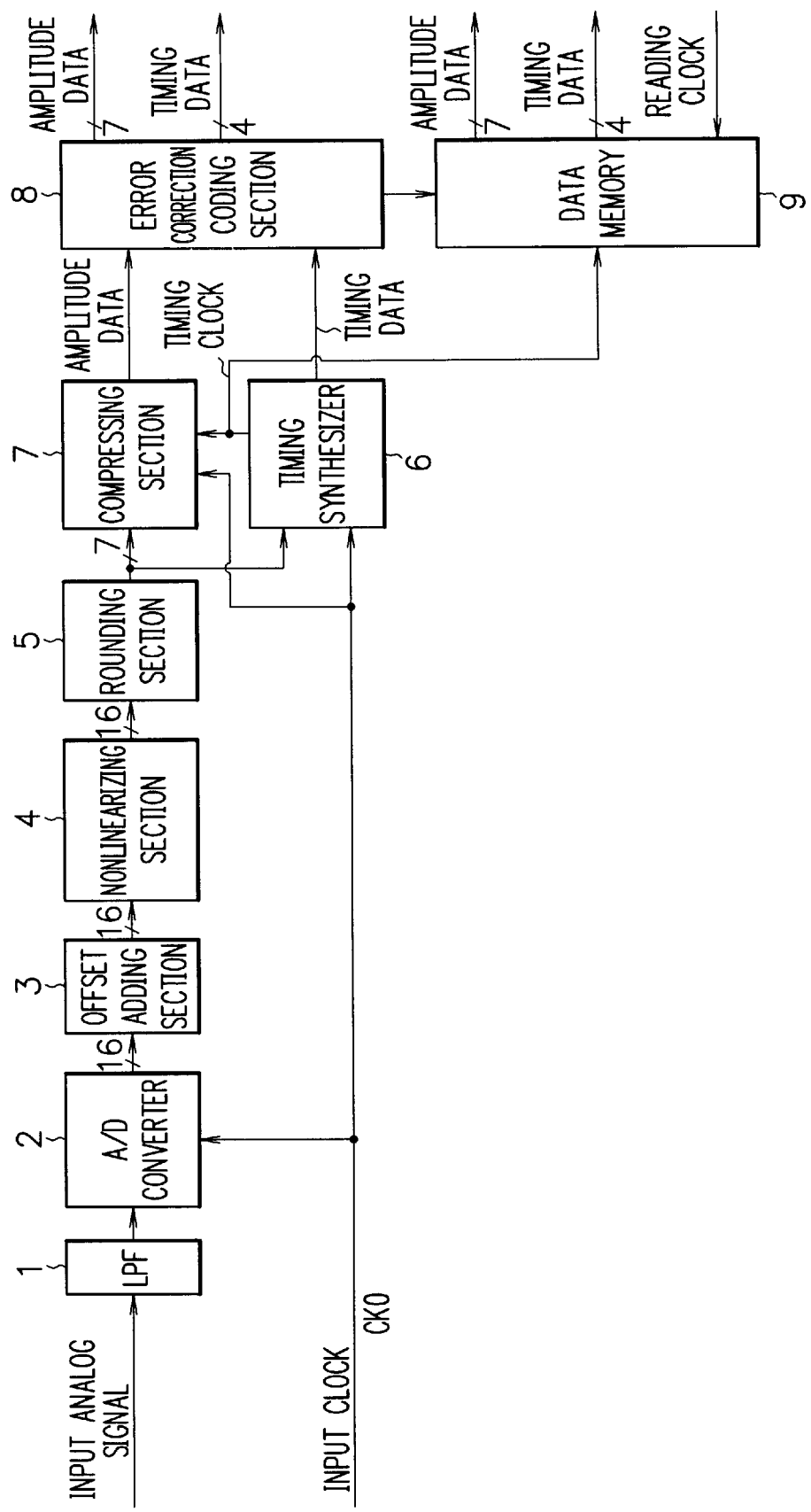

BEFORE ADDING OFFSET

AFTER ADDING OFFSET

FIG. 5
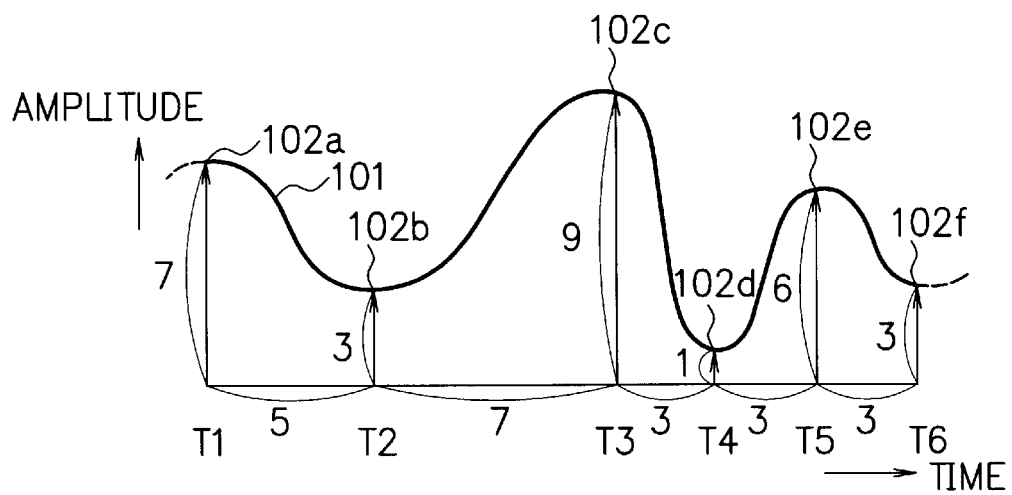
FIG. 6
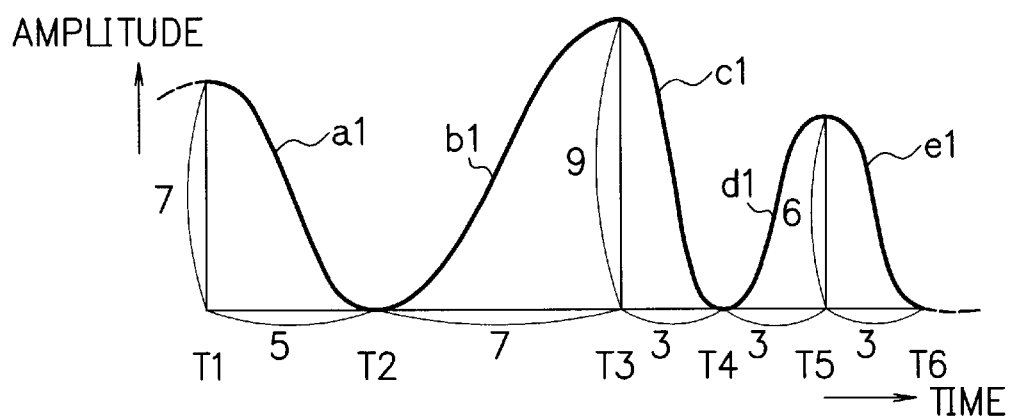
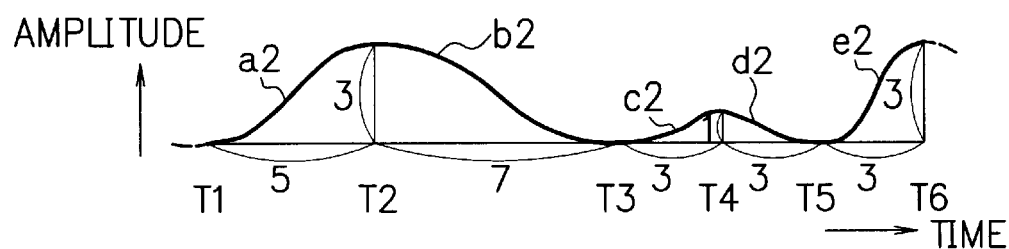

| OUTPUT SIGNAL (Dout) | OUTPUT SIGNAL AFTER PROCESSING |
|---|---|
| ① 0~8191 | Dout×2 |
| ② 8192~16383 | Dout+8192 |
| ③ 16384~49151 | Dout×0.5+16384 |
| ④ 49152~57343 | Dout−8192 |
| ⑤ 57344~65535 | Dout×2−65536 |

F I G. 11
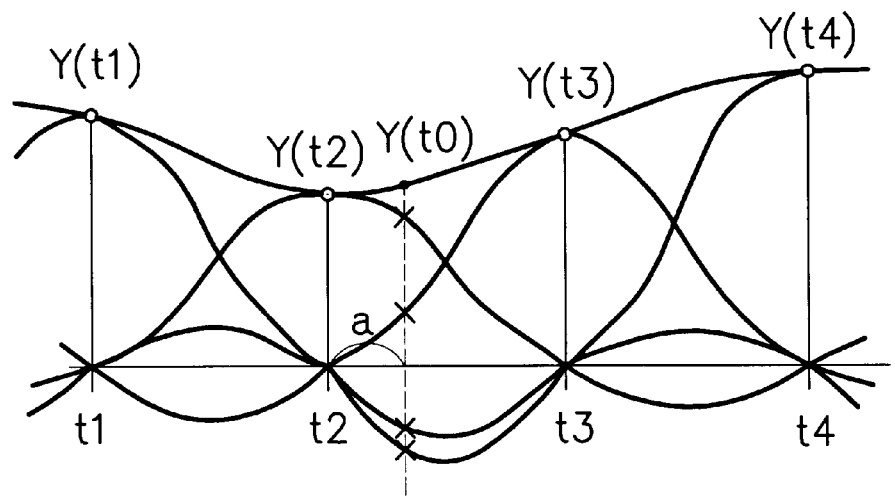
F I G. 12
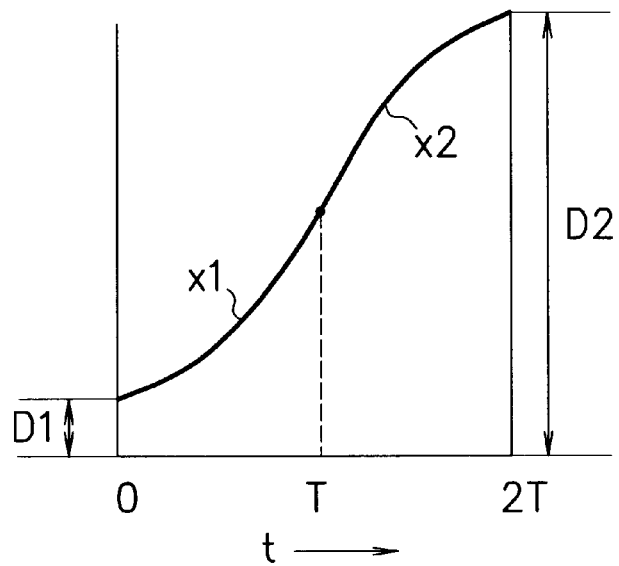

FIG. 16

| | | | | | | | | | | |
|---|---|---|---|---|---|---|---|---|---|---|
| 0 | 0 | 0 | 0 | 0 | 0 | 0 | 0 | 0 | 0 | 0 |
| −0.125 | 0 | 0 | 0 | −0.031 | 0 | 0 | 0 | −0.008 | | −0.004 |
| −0.125 | −0.125 | 0 | 0 | −0.063 | −0.031 | 0 | 0 | −0.023 | −0.008 | −0.016 |
| −0.125 | −0.125 | −0.125 | 0 | −0.094 | −0.063 | −0.031 | 0 | −0.047 | −0.023 | −0.035 |
| −0.125 | −0.125 | −0.125 | −0.125 | −0.125 | −0.094 | −0.063 | −0.031 | −0.078 | −0.047 | −0.063 |
| 0.125 | −0.125 | −0.125 | −0.125 | −0.063 | −0.125 | −0.094 | −0.063 | −0.086 | −0.078 | −0.082 |
| 0.125 | 0.125 | −0.125 | −0.125 | 0 | −0.063 | −0.125 | −0.094 | −0.07 | −0.086 | −0.078 |
| 0.125 | 0.125 | 0.125 | −0.125 | 0.0625 | 0 | −0.063 | −0.125 | −0.031 | −0.07 | −0.051 |
| 0.125 | 0.125 | 0.125 | 0.125 | 0.125 | 0.0625 | 0 | −0.063 | 0.0313 | −0.031 | 0 |
| 1 | 0.125 | 0.125 | 0.125 | 0.3438 | 0.125 | 0.0625 | 0 | 0.1328 | 0.0313 | 0.082 |
| 1 | 1 | 0.125 | 0.125 | 0.5625 | 0.3438 | 0.125 | 0.0625 | 0.2734 | 0.1328 | 0.2031 |
| 1 | 1 | 1 | 0.125 | 0.7813 | 0.5625 | 0.3438 | 0.125 | 0.4531 | 0.2734 | 0.3633 |
| 1 | 1 | 1 | 1 | 1 | 0.7813 | 0.5625 | 0.3438 | 0.6719 | 0.4531 | 0.5625 |
| 1 | 1 | 1 | 1 | 1 | 1 | 0.7813 | 0.5625 | 0.8359 | 0.6719 | 0.7539 |
| 1 | 1 | 1 | 1 | 1 | 1 | 1 | 0.7813 | 0.9453 | 0.8359 | 0.8906 |
| 1 | 1 | 1 | 1 | 1 | 1 | 1 | 1 | 1 | 0.9453 | 0.9727 |
| 1 | 1 | 1 | 1 | 1 | 1 | 1 | 1 | 1 | 1 | 1 |
| 0.125 | 1 | 1 | 1 | 0.7813 | 1 | 1 | 1 | 0.9453 | 1 | 0.9727 |
| 0.125 | 0.125 | 1 | 1 | 0.5625 | 0.7813 | 1 | 1 | 0.8359 | 0.9453 | 0.8906 |
| 0.125 | 0.125 | 0.125 | 1 | 0.3438 | 0.5625 | 0.7813 | 1 | 0.6719 | 0.8359 | 0.7539 |
| 0.125 | 0.125 | 0.125 | 0.125 | 0.125 | 0.3438 | 0.5625 | 0.7813 | 0.4531 | 0.6719 | 0.5625 |
| −0.125 | 0.125 | 0.125 | 0.125 | 0.0625 | 0.125 | 0.3438 | 0.5625 | 0.2734 | 0.4531 | 0.3633 |
| −0.125 | −0.125 | 0.125 | 0.125 | 0 | 0.0625 | 0.125 | 0.3438 | 0.1328 | 0.2734 | 0.2031 |
| −0.125 | −0.125 | −0.125 | 0.125 | −0.063 | 0 | 0.0625 | 0.125 | 0.0313 | 0.1328 | 0.082 |
| −0.125 | −0.125 | −0.125 | −0.125 | −0.125 | −0.063 | 0 | 0.0625 | −0.031 | 0.0313 | 0 |
| 0 | −0.125 | −0.125 | −0.125 | −0.094 | −0.125 | −0.063 | 0 | −0.07 | −0.031 | −0.051 |
| 0 | 0 | −0.125 | −0.125 | −0.063 | −0.094 | −0.125 | −0.063 | −0.086 | −0.07 | −0.078 |
| 0 | 0 | 0 | −0.125 | −0.031 | −0.063 | −0.094 | −0.125 | −0.078 | −0.086 | −0.082 |
| 0 | 0 | 0 | 0 | 0 | −0.031 | −0.063 | −0.094 | −0.047 | −0.078 | −0.063 |
| 0 | 0 | 0 | 0 | 0 | 0 | −0.031 | −0.063 | −0.023 | −0.047 | −0.035 |
| 0 | 0 | 0 | 0 | 0 | 0 | 0 | −0.031 | −0.008 | −0.023 | −0.016 |
| 0 | 0 | 0 | 0 | 0 | 0 | 0 | 0 | 0 | −0.008 | −0.004 |
| 0 | 0 | 0 | 0 | 0 | 0 | 0 | 0 | 0 | 0 | 0 |

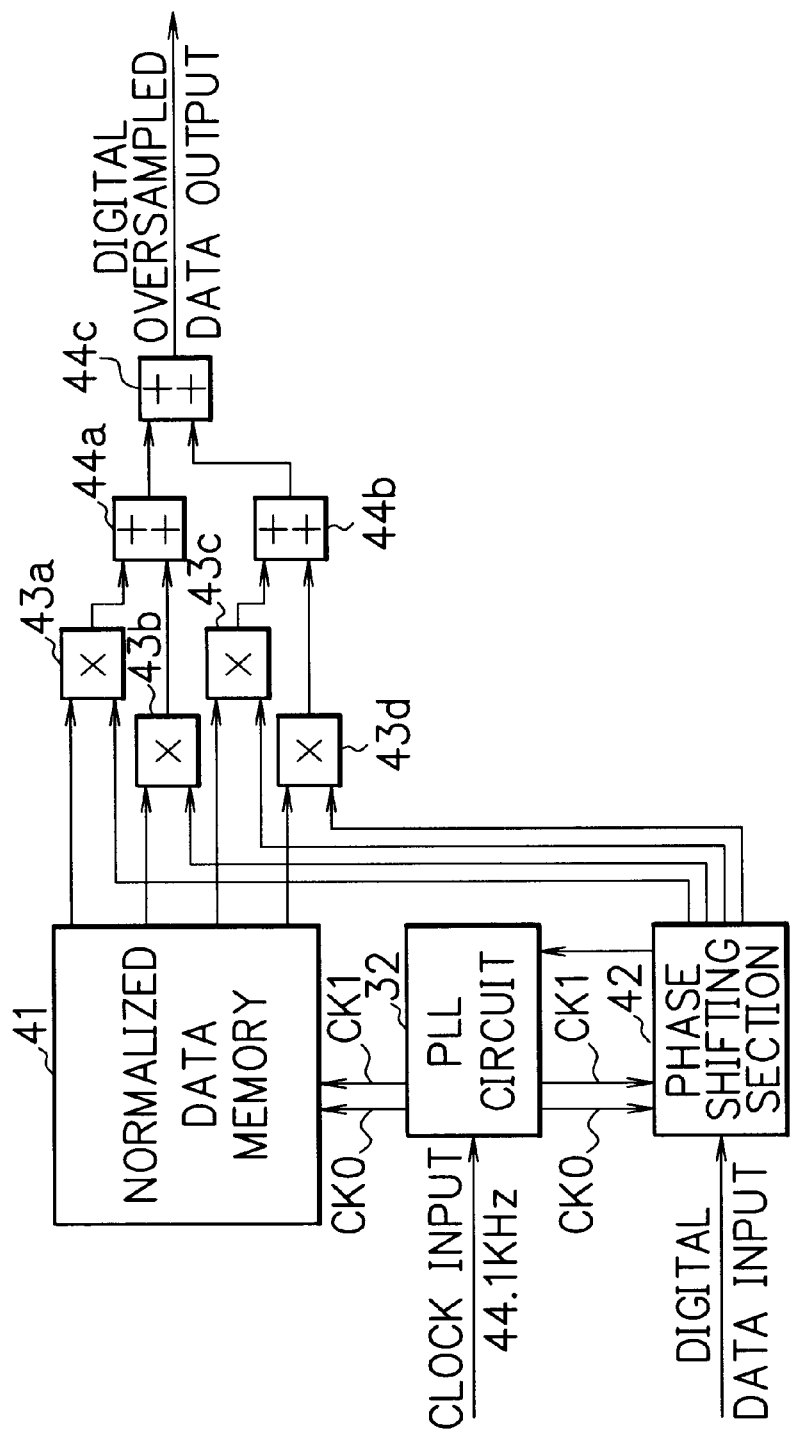

COMPRESSING METHOD AND DEVICE, DECOMPRESSION METHOD AND DEVICE, COMPRESSION/DECOMPRESSION SYSTEM, AND RECORDED MEDIUM

BACKGROUND OF THE INVENTION

1. Field of the Invention

The present invention relates to a compressing method and device, an expanding method and device, a compressing and expanding system, and a recording medium and particularly concerns a method of compressing and expanding a continuous analog signal or digital signal.

2. Description of the Related Art

Conventionally, when transmitting and storing a signal such as a picture signal and an aural signal that has a large amount of information, a signal has been compressed and expanded in order to reduce an amount of transmitted information, increase a storing time of a storage medium, and so on. Generally, when an analog signal is compressed, an analog signal is initially sampled according to a predetermined sampling frequency and is digitized, and compression is performed on the obtained digital data.

For example, in the case of compression on a picture signal and an aural signal, a method is used in which compression is performed on a frequency region after original data is processed using a conversion filter on a time base-frequency axis such as DCT (Discrete-Cosine-Transform). DPCM (Differential Pulse Code Modulation), which is frequently used as a method of compressing an aural signal for a telephone line, is used with the same intention. Additionally, the DPCM compression is a method for coding a differential of adjacent sample values when a waveform is sampled.

Further, as a method for performing time/frequency conversion, a method using a sub-band filter and MDCT (Modified Discrete Cosine Transform) is also available. As a coding method using such a method, MPEG (Moving Picture Image Coding Experts Group) audio is applicable.

Further, the most widely used picture compressing system is generally known as the MPEG standard.

Data compressed by the above compressing method is basically expanded according to reversed operations of the same compressing method.

Namely, after compressed digital data is converted from a signal of a frequency region to a signal of a time region by frequency/time conversion, predetermined expanding operations are carried out to reproduce original digital data. And then, the original data obtained thus is subjected to digital-analog conversion if necessary and is outputted as an analog signal.

However, in the above conventional compressing and expanding method, a signal on a time base is converted to a signal on a frequency axis before compression. Hence, operations such as time/frequency conversion for compression and frequency/time conversion for expansion are necessary. Therefore, the operations are complicated and the configuration for realizing the operations becomes extremely complicated. This problem has caused not only a longer processing time for compression and expansion but also difficulty in achieving a smaller device.

Moreover, generally in the case of compression and expansion of data, it is important to consider how to improve the quality of reproduced data while improving its compressibility. However, in the above conventional compressing and expanding method, when a compressibility of a picture signal and an aural signal is increased, an image and voice reproduced by expanding compressed data are degraded in quality. In contrast, when importance is placed on the quality of a reproduced image and reproduced voice, a picture signal and an aural signal decrease in compressibility. Therefore, it has been extremely difficult to achieve both of an increased compressibility and improved quality of reproduced data.

The present invention is devised to solve the above problems and aims to simplify the compressing and expanding operations for a signal so as to shorten a processing time and to simplify the configuration for realizing the operations.

Also, another object of the present invention is to provide a new compressing and expanding method for realizing both of an increased compressibility and improved quality of reproduced data.

SUMMARY OF THE INVENTION

In order to solve the above problems, on a compression side of the present invention, signed digital data to be compressed is converted to unsigned digital data by adding an offset value to the signed digital data, a rounding operation of a lower-order bit is performed on the unsigned digital data, and then, the digital data undergoing the rounding operation is sampled at a time interval of a point where a differential value varies in polarity. Thus, a pair of a discrete amplitude data value on each sample point and a timing data value indicative of a time interval between sample points is obtained as compressed data.

Further, on an expansion side, after an amplitude data value included in the compressed data is multiplied by the number of bits rounded on the compression side, interpolation data for interpolating amplitude data having a time interval indicated by the timing data is obtained by using an amplitude data value obtained thus and a timing data value included in the compressed data, and an offset value equal to that of the compression side is subtracted from the interpolation data so as to obtain expanded data.

In another embodiment of the present invention, on a compression side, unsigned digital data generated by adding the offset value is subjected to the rounding operation after a data value is changed by performing a different operation for each value, and on an expansion side, amplitude data generated by the multiplying operation is subjected to the operation for generating the interpolation data after a data value is changed by performing a different operation for each value.

In another embodiment of the present embodiment, when a time interval between the sample points exceeds a value represented by the number of bits assigned to the timing data, a time interval between the sample points is represented by the sum of a plurality of timing data values.

In another embodiment of the present invention, on a compression side, a digital interpolation value for the discrete data is computed by synthesizing digital data, which has a basic waveform corresponding to values of n pieces of inputted discrete data, by oversampling and a moving average operation or a convoluting operation, and a pair of the amplitude data and timing data is obtained as compressed data based on the oversampled data.

Since the present invention is realized by the above techniques, when a signal is compressed on a time base, it is possible to perform time/frequency conversion and carry out operations on the time base without necessity for an operation on a frequency axis. Also, when data compressed thus is expanded as well, the operation can be performed on the time base. Therefore, it is possible to simplify the compressing and expanding operations, shorten a processing time, and realize a simple configuration for the operations. Further, when compressed data is transmitted from the compression side and is reproduced on the expansion side as well, compressed data inputted to the expansion side can be sequentially processed and reproduced by a simple interpolating operation on a time base, thereby achieving real-time operations.

Additionally, according to the present invention, a data length can be reduced by several bits per word by performing a rounding operation of a lower-order bit on unsigned digital data whose values are all made positive by adding an offset value. Thus, it is possible to largely cut an amount of data. Moreover, it is possible to obtain only data on the sample points as compressed data from data compressed by rounding for each word, thereby achieving a high compressibility. At this moment, digital data to be subjected to a rounding operation is concentrated on some of all data regions represented by the number of bits, but the digital data appears less frequently on a data region around an end (a data region of lower-order bits to be cut). Therefore, even when lower-order bits are reduced from such data, it is possible to suppress degradation in quality of the data reproduced on the expansion side.

According to another characteristic of the present invention, on a compression side, a nonlinearizing operation is performed for shifting the relationship of an input data value and an output data value from a one-to-one relationship before a rounding operation. Thus, in a data region where data is used most frequently, it is possible to obtain the same effect as a rounding operation using a value smaller than an actual value of the rounding operation, thereby reducing the influence of the rounding operation on reproduced data. Hence, it is possible to further suppress degradation in quality of reproduced data.

According to another characteristic of the present invention, when a time interval between sample points exceeds a value represented by the number of bits assigned to timing data, by representing a time interval between the sample points by the sum of a plurality of timing data values, it is possible to assign to timing data a sufficiently small number of bits required for many cases without assigning a large number of bits to timing data in a large timing interval appearing exceptionally, thereby improving a compressibility.

According to another characteristic of the present invention, continuous interpolation values can be obtained for original discrete data merely by performing oversampling and a moving average operation or a convoluting operation on digital data, which has a basic waveform corresponding to inputted discrete data. When an interpolation value is computed, only a limited number of discrete data values need to be considered. Thus, a censoring error does not occur, an accurate interpolation value can be obtained, and reproducibility of original data before compression can be improved regarding data reproduced on the expansion side when a compressing operation is performed using the interpolation value.

As described above, according to the present invention, it is possible to provide a new compressing and expanding method for realizing both of a high compressibility and improved quality of reproduced data with a simple configuration and a shorter compressing and expanding time.

BRIEF DESCRIPTION OF THE DRAWINGS

FIG. 1 is a block diagram showing an example of the configuration of a compressing device according to Embodiment 1;

FIG. 5 is a diagram showing an example of the operation performed in a compressing section and the timing synthesizer;

FIG. 6 is a diagram showing an example of the operation performed in an expanding section;

FIG. 11 is a diagram showing the relationship between discrete data and interpolation values between the discrete data;

FIG. 12 is a diagram for explaining an interpolating equation, which is a specific example of data interpolation on an expansion side;

FIG. 16 is a diagram for explaining an example of the operation of oversampling and convolution according to Embodiment 2;

FIG. 18 is a diagram showing an example of the configuration of an oversampling circuit shown in FIG. 13.

DETAILED DESCRIPTION OF THE PREFERRED EMBODIMENTS

Embodiment 1

Figure 2A:
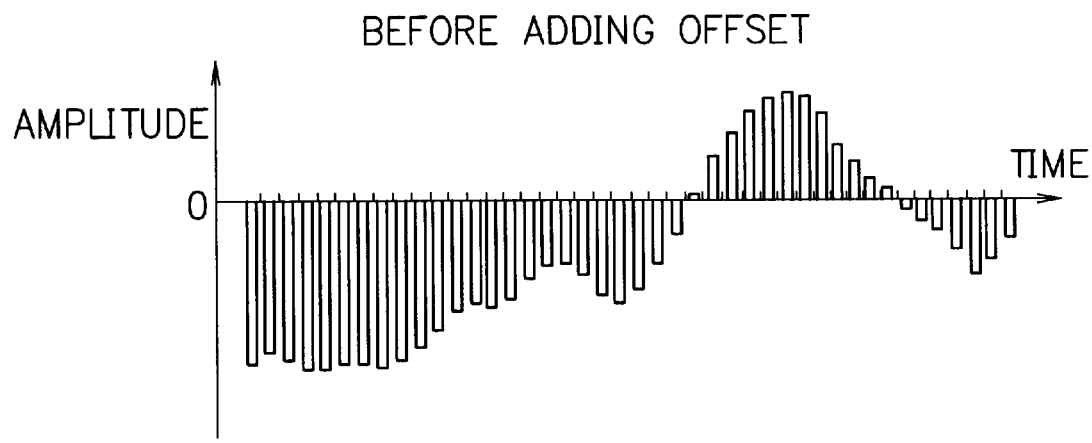
FIGS. 2A and 2B are diagrams showing an example of the operation performed in an offset adding section.

The following will discuss an embodiment of the present invention in accordance with the accompanied drawings.

In a compressing device of the present embodiment, first, when an analog signal is inputted as a signal to be compressed, the input analog signal is subjected to A/D conversion and is converted to signed digital data. And then, the signed digital data is converted to unsigned digital data by adding an offset value to the signed digital data. Further, the unsigned digital data obtained thus undergoes a nonlinearizing operation, which will be discussed later.

Next, a rounding operation of a lower-order bit is performed on the digital data on which the nonlinearizing operation has been carried out. And then, the digital data undergoing the rounding operation is differentiated for one time for each sample point, and a point where a differential value varies in polarity is detected as a sample point. Subsequently, an amplitude data value on each detected sample point and a timing data value indicative of a time interval of the sample points are obtained, and a pair of the amplitude data value and the timing data value is transmitted or recorded as compressed data.

Meanwhile, in an expanding device for compressed data generated thus, first, an amplitude data value of inputted compressed data (a pair of an amplitude data value and a timing data value) is multiplied by the number of bits, which have undergone a rounding operation on a compression side. And then, digital data obtained thus undergoes a linearizing operation, which is opposite to the nonlinearizing operation of the compression side.

And then, interpolation data for interpolating individual amplitude data values is generated by an interpolating operation using an amplitude data value obtained by the linearizing operation and a timing data included in compressed data. Moreover, an offset value equal to that of the compression side is subtracted from the generated interpolation data. Digital data obtained thus is subjected to D/A conversion if necessary, is converted to an analog signal, and is outputted.

FIG. 1 is a block diagram showing an example of the entire configuration of the compressing device for realizing the above compressing method according to Embodiment 1.

As shown in FIG. 1, the compressing device of the present embodiment is constituted by a low-pass filter (LPF) 1, an A/D converter 2, an offset adding section 3, a nonlinearizing section 4, a rounding section 5, a timing synthesizer 6, a compressing section 7, an error correction coding section 8, and a data memory 9.

The compressing device of FIG. 1 digitizes an analog signal before compression. The following will discuss the compression of an aural signal as an example of an analog signal.

In FIG. 1, in order to readily detect a sample point, an inputted analog signal is converted to digital data by the A/D converter 2 after noise is removed by the LPF 1.

At this moment, the A/D converter 2 performs A/D conversion according to an input clock CK0 having a predetermined frequency (e.g., 44.1 KHz in the case of an aural signal). Hence, the inputted analog signal is converted to, for example, signed digital data of 16 bits. Here, in the configuration of FIG. 1, it is assumed that an analog aural signal is inputted. Signed digital data may be directly inputted from outside. In this case, the LPF 1 and the A/D converter 2 are not necessary.

Figure 2B:
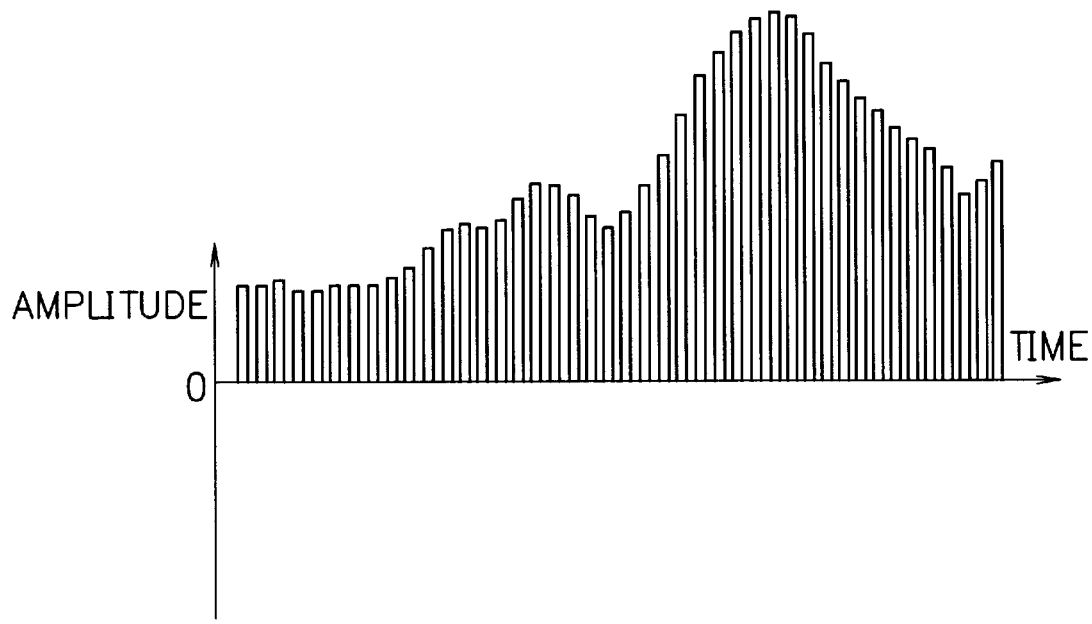

The offset adding section 3 converts signed digital data to unsigned digital data by adding a predetermined offset value to the signed digital data outputted from the A/D converter 2. FIGS. 2A and 2B are diagrams for explaining an example of the operation performed in the offset adding section 3. FIG. 2A shows an example of signed digital data outputted from the A/D converter 2, and FIG. 2B shows an example of digital data obtained by adding an offset value to the digital data.

As shown in FIG. 2A, digital data digitized from an analog aural signal normally serves as data which swings to both positive and negative sides while amplitude of 0 is provided at the center. The data is converted so as to swing only to the positive side as shown in FIG. 2B by adding a predetermined offset value to the data. For example, when digital data outputted from the A/D converter 2 is signed 16-bit data, since $2^{15}=32768$ is added as an offset value, it is possible to obtain data whose amplitude swings only in the positive direction while maintaining a digital waveform.

Figure 3:
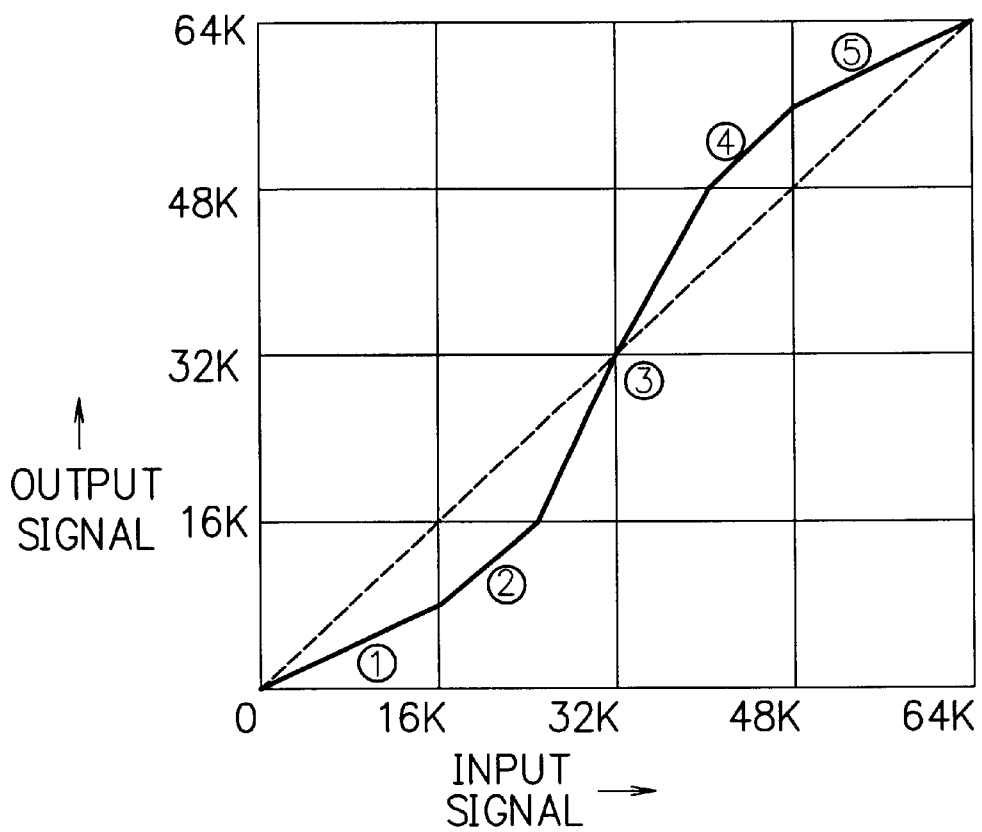
FIG. 3 is a diagram showing an example of the operation performed in a nonlinearizing section.

The nonlinearizing section 4 performs the following nonlinearizing operation on unsigned digital data of FIG. 2(b) that is outputted from the offset adding section 3. FIG. 3 is a diagram for explaining an example of the operation performed in the nonlinearizing section 4. Namely, by changing amplitude of an outputted signal according to amplitude of an inputted signal, the nonlinearizing section 4 forms a nonlinear relationship as a whole as shown by a solid line, instead of a one-to-one relationship of an input signal and an output signal (a straight line inclined by 45 degrees when an input signal axis and an output signal axis have the same scales) that is shown by a dotted line of FIG. 3.

In this example, when data inputted by the offset adding section 3 has amplitude of 0 to 16383 or 49152 to 65535, an amplitude value of the inputted data is halved and outputted ((1), (5)). Further, when data inputted by the offset adding section 3 has amplitude of 16384 to 24575 or 40960 to 49151, an amplitude value of the inputted data is outputted as it is ((2), (4)). Besides, when data inputted by the offset adding section 3 has amplitude of 24576 to 40959, an amplitude value of the inputted data is doubled and outputted (3).

When an aural signal of audible tone is digitized and an offset value is added thereto, regarding all data regions (0 to 65535) represented by 16 bits, most data is concentrated on a data region around the center and data appears less frequently on a data region around an end. Hence, in the present embodiment, an amplitude of output (inclination of a straight line) is doubled relative to input (3) in a data region around the center where data is used most frequently. Meanwhile, in a data region around an end where data is used less frequently, an amplitude of output (inclination of a straight line) is halved relative to input ((1), (5)).

The rounding section 5 performs a rounding operation of a lower-order bit on digital data in which the relationship of an amplitude between an input signal and an output signal is made nonlinear by the nonlinearizing section 4 as shown in FIG. 3. For example, the rounding section 5 performs an operation for rounding a lower-order bit of digital data, which is outputted from the nonlinearizing section 4, at 256 or 512. The following will discuss a rounding operation at 512. A data length can be shortened by 9 bits per word by rounding data at 512. Hence, a large amount of data can be reduced.

Incidentally, in the present embodiment, digital data inputted to the rounding section 5 has 16 bits and a large data value up to 65535 can be represented. Additionally, as described above, most data is concentrated on a data region around the center and appears less frequently on a data region around the end. In other words, data actually used as aural data has a relatively large value in many cases. Thus, even when 9 bits of a lower order are cut from data having such a large value (even when rounding is made at a small value of 512), the quality of reproduced voice is hardly affected.

Besides, in the present embodiment, an amplitude of output (inclination of a straight line) relative to input is doubled by using the nonlinearizing section 4 in a data region around the center where data is used most frequently. Thus, in such a region, the same effect as a rounding operation can be obtained at a half value of an actual value of a rounding operation. Namely, even when a lower bit of data is actually rounded at 512, it is possible to achieve substantially the same effect as rounding at 256. Hence, the effect of a rounding operation can be lessened and the influence on the quality of reproduced voice can be further reduced.

Digital data, on which a rounding operation of a lower-order bit is performed by the rounding section 5, is inputted to the timing synthesizer 6 and the compressing section 7. The timing synthesizer 6 differentiates for one time digital data supplied from the rounding section 5 and detects a sample point according to a change in polarity of a differential value. And then, a timing clock, which is indicative of timing of the detected point, and timing data (the number of clocks CK0), which is indicative of time intervals between sample points, are computed and outputted.

Figure 4:
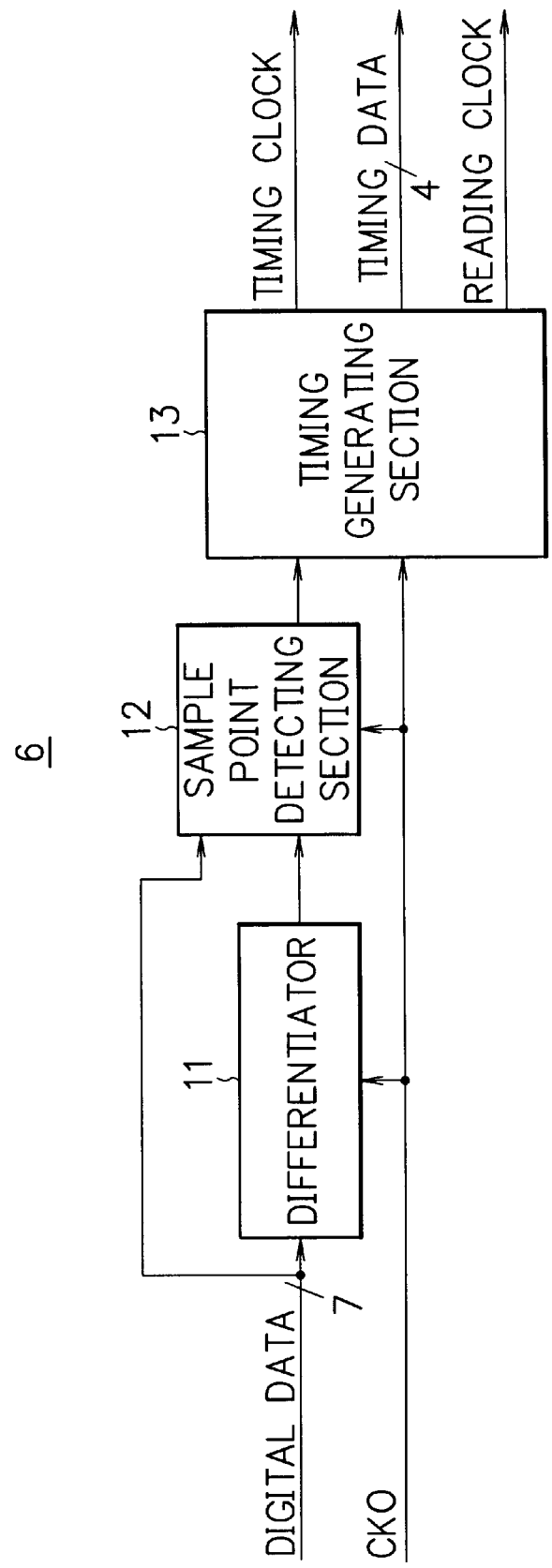
FIG. 4 is a block diagram showing an example of the configuration of a timing synthesizer.

FIG. 4 is a block diagram showing an example of the configuration of the timing synthesizer 6. In FIG. 4, a differentiator 11 differentiates for one time digital data inputted from the rounding section 5. At this moment, the differentiator 11 differentiates digital data every time the input clock CK0 having a predetermined frequency is supplied, that is, on each sample point. A differential value is computed by subtracting data, which is captured on a previous timing, from the current data captured at a timing of the input clock CK0. At this moment, a point with no data has a default value.

Also, according to a differential value computed by the differentiator 11 and digital data outputted from the rounding section 5, a sample point detecting section 12 detects a point where a differential value of digital data varies in polarity as a sample point.

For example, the sample point detecting section 12 firstly detects a point on which polarity of a differential value changes from positive to negative, a point on which polarity of a differential value changes from negative to positive, and a point on which a differential value is 0. And then, as for a point on which polarity of a differential value changes from positive to negative, out of positive and negative points, a point receiving a larger digital data value from the rounding section 5 is detected as a sample point. Further, as for a point on which polarity of a differential value changes from negative to positive, out of positive and negative points, a point receiving a smaller digital data value from the rounding section 5 is detected as a sample point. Moreover, as for a point on which a differential value is 0, the point is detected as a sample point. Besides, when two or more points successively appear with a differential value of 0, for example, the positions on both ends are detected as sample points.

A timing generating section 13 counts the number of clocks CK0, which are supplied from when a sample point is detected to when a subsequent sample point is detected. The timing generating section 13 outputs the number as timing data and outputs a timing clock indicative of timing of a detected point of each sample point. In the present embodiment, the timing data is represented by, for example, 4 bits. Further, the timing generating section 13 also produces and outputs a reading clock, which will be discussed later.

When timing data is represented by 4 bits, a range from 0 to 15 can represent the number of clocks between successive two sample points. Therefore, when an interval between sample points is 16 clocks or more, overflowing occurs and timing data cannot be represented in an accurate manner. Therefore, in the present embodiment, when a clock interval exceeds 15, a target clock interval is represented by the sum of a plurality of pieces of clock data. At this moment, an amplitude data value is set at 0 in order to identify the sum of a plurality of pieces of clock data on an expansion side.

Namely, in the present embodiment, a predetermined offset value is added to original data by the offset adding section 3. Thus, 0 is not used as an amplitude data value under normal conditions. Therefore, an amplitude data value of 0 that is not normally used is applicable as identifying information for representing the sum of a plurality of pieces of clock data. For example, when an amplitude data value is A at one sample point and a clock interval from the previous sample point is 35, a pair of a timing data value and an amplitude data value includes (15,0), (15,0), and (5,A).

As described above, a clock interval between the sample points exceeds 15 less frequently and can be represented by a pair of a timing data value and an amplitude data value in many cases. Therefore, instead of allocating many bits to timing data for an exceptional case, a sufficient number of bits (4 bits) required for many cases are assigned to timing data. And then, only when a clock interval exceeds 15 in an exceptional case, a clock interval is represented by a plurality of pairs of a timing data value and an amplitude data value. Hence, an amount of data can be further reduced.

Moreover, the compressing section 7 takes out only digital data on a corresponding sample point and outputs the digital data as amplitude data according to a timing clock outputted from the timing synthesizer 6. A pair of amplitude data and timing data is transmitted or recorded as compressed data. The amplitude data on each sample point is outputted from the compressing section 7 and the timing data indicative of a time interval between sample points is outputted from the timing synthesizer 6.

The error correction coding section 8 adds an error correcting code to data supplied from the timing synthesizer 6 and the compressing section 7 in order to detect and correct a varied bit accurately even when digital data on a transmission line or a memory is changed by noise and the like and an error occurs. And then, the data obtained thus is outputted onto the transmission line or the data memory 9 as compressed data.

The data memory 9 is a recording medium for storing compressed data. The data memory 9 captures and records compressed data generated by the error correction coding section 8, according to a timing clock from the timing synthesizer 6. Further, the data memory 9 reads and outputs stored compressed data according to a reading clock supplied from outside. A pair of amplitude data and timing data that is read from the data memory 9 is transmitted or recorded as compressed data.

As a pattern of outputting compressed data, a pair of amplitude data and timing data is formed into a data block, a header is added to the front of the data block, and the data block is outputted. The header includes information such as an identification mark of the header, the number of bits of timing data (4 bits in the present embodiment), and the number of bits of amplitude data (8 bits when rounding is made at 256 and 7 bits when rounding is made at 512). After such a header, data blocks composed of a pair of amplitude data and timing data are provided in ascending order.

FIG. 5 is a diagram for explaining a principle of the compressing operation performed by the timing synthesizer 6 and the compressing section 7. Besides, data inputted to the timing synthesizer 6 and the compressing section 7 is digital data provided after an inputted analog signal is processed. For explanation, FIG. 5 shows a waveform of digital data in an analog form. The digital data is outputted from the rounding section 5. Moreover, a numerical value shown in FIG. 5 is a numerical value for explanation and does not correspond to an actual numerical value.

In the present embodiment, from digital data 101 outputted from the rounding section 5, points 102a to 102f where differential values vary in polarity are detected as sample points. And then, amplitude data values on the sample points 102a to 102f and timing data values indicative of time intervals of the sample points 102a to 102f are computed. A pair of an amplitude data value and a timing data value is transmitted or recorded as compressed data.

In the example of FIG. 5, "7, 3, 9, 1, 6, 3" are computed as digital amplitude data values on the sample points 102a to 102f. "5, 7, 3, 3, 3" are computed as timing data indicative of time intervals between time T1 and T2, T2 and T3, T3 and T4, T4 and T5, and T5 and T6, on which the sample points 102a to 102f appear. Additionally, the number indicated as timing data represents the number of clocks CK0 based on a certain sampling frequency.

At time T1, an amplitude data value "7" of the sample point 102a and a timing data value (not shown) indicative of a time interval from a previously detected sample point (not shown) are obtained. Thus, a pair of the data values is transmitted or recorded as compressed data of time T1.

Next, at time T2 when the sample point 102b is detected, a timing data value "5", which is indicative of a time interval from time T1 when the sample point 102a is previously detected, and an amplitude data value "3" of the sample point 102b are obtained. Thus, a pair of the data values (5, 3) is transmitted or recorded as compressed data of time T2.

At time T3 when the sample point 102c is detected, a timing data value "7", which is indicative of a time interval from time T2 when the sample point 102b is previously detected, and an amplitude data value "9" of the sample point 102c are obtained. Thus, a pair of the data values (7, 9) is transmitted or recorded as compressed data of time T3.

In this manner, pairs of (3,1), (3,6), and (3,3) are transmitted or recorded as compressed data of time T4, T5, and T6. The pairs include timing data values indicative of time intervals between time T3 and T4, T4 and T5, and T5 and T6, and include amplitude data values of the sample points 102d, 102e, and 102f that are detected in time T4, T5, and T6.

The following will discuss an expanding device corresponding to the above-mentioned compressing device.

Figure 7:
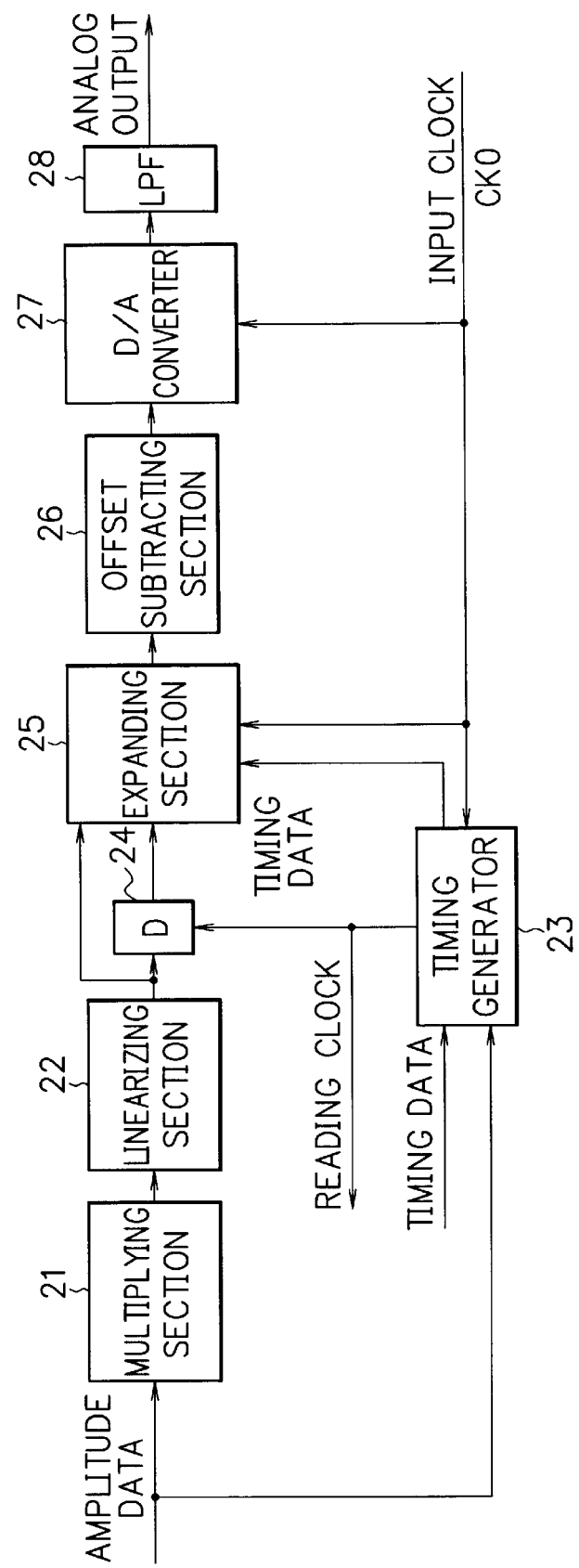
FIG. 7 is a block diagram showing an example of the configuration of an expanding device according to Embodiment 1.

FIG. 7 is a block diagram showing an example of the configuration of the expanding device according to the present embodiment. As shown in FIG. 7, the expanding device of the present embodiment is constituted by a multiplying section 21, a linearizing section 22, a timing generator 23, a D-type flip flop 24, an expanding section 25, an offset subtracting section 26, a D/A converter 27, and an LPF 28.

The multiplying section 21 multiplies an inputted amplitude data value by the number of bits that is rounded by the rounding section 5 on a compression side. In the present embodiment, since rounding is performed at 512, the multiplying section 21 multiplies an inputted amplitude data value by 512. The linearizing section 22 performs a linearizing operation on the amplitude data multiplied by 512. The linearizing operation is the reverse of a nonlinearizing operation on a compression side.

Figure 8:
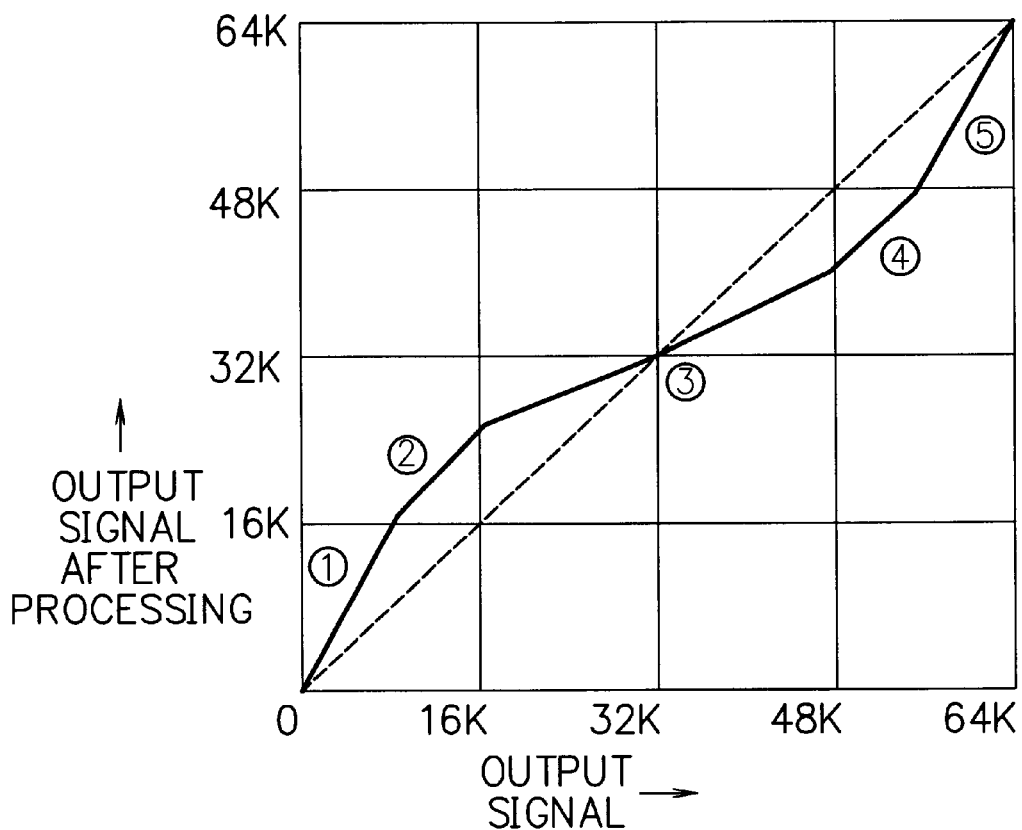
FIG. 8 is a diagram showing an example of the operation of a linearizing section.

FIG. 8 is a diagram for explaining an example of an operation performed in the linearizing section 22. As shown in FIG. 8, the linearizing section 22 performs an operation for changing amplitude of an outputted signal according to amplitude of an inputted signal. At this moment, amplitude is changed in a reversed manner of the nonlinearizing section 4.

Namely, when data inputted from the multiplying section 21 has amplitude of 0 to 8191 or 57344 to 65535, an amplitude value of inputted data is doubled and outputted ((1), (5)). Moreover, when data inputted from the multiplying section 21 has amplitude of 8192 to 16383 or 49152 to 57343, an amplitude value of inputted data is outputted as it is ((2), (4)). Besides, when data inputted from the multiplying section 21 has amplitude of 16384 to 49151, an amplitude value of inputted data is halved and outputted (3).

The timing generator 23 generates reading clocks, which represent irregular time intervals just like the sample points detected on a compression side, from an input clock CK0 in response to timing data included in compressed data. At this moment, the timing generator 23 monitors if an amplitude data value corresponding to the timing data is 0 or not. And then, when an amplitude data value is 0, a time interval between sample points is computed by adding timing data to be subsequently received. The reading clock is outputted at timing obtained by summing a plurality of timing data values.

The D-type flip flop 24 successively captures and stores amplitude data outputted from the linearizing section 22 at timing corresponding to the reading clocks generated by the timing generator 23, and the D-type flip flop 24 outputs the amplitude data to the expanding section 25. Amplitude data of an input/output stage of the D-type flip flop 24, that is, amplitude data stored in the D-type flip flop 24 at timing of a reading clock and amplitude data to be stored in the D-type flip flop 24 at timing of the subsequent reading clock (two pieces of amplitude data on two successive sample points) are inputted to the expanding section 25.

The expanding section 25 generates digital interpolation data between the sample points by a predetermined interpolating operation or a convoluting operation using two pieces of amplitude data inputted thus and timing data inputted by the timing generator 23. And then, the digital interpolation data generated thus is outputted to the offset subtracting section 26.

Additionally, in the interpolating operation, when two or more points having differential values of 0 are successively provided and the positions of both ends are detected as sample points in the sample point detecting section 12 of the timing synthesizer 6 on the compression side, no voice is inputted or a constant value is inputted. Hence, interpolation data is generated with a constant amplitude value.

The offset subtracting section 26 subtracts an offset value, which is equal to an offset value added by the offset adding section 3 on the compression side, from interpolation data generated by the expanding section 25. Thus, while a waveform of digital data is maintained, data with amplitude swinging only in a positive direction on the compression side is returned to data which swings to both of positive and negative sides with amplitude of 0 being provided at the center. Digital data obtained thus is converted to an analog signal by the D/A converter 27, and then, the digital data is outputted as a reproduced analog signal via the LPF 28.

FIG. 6 is a diagram for explaining a principle of the expanding operation performed by the expanding section 25. Besides, data inputted to the expanding section 25 is digital data which has undergone multiplication and a linearizing operation. For explanation, FIG. 6 shows a waveform of digital data in an analog form. Further, the following will discuss the expanding operation of compressed data generated in the example of FIG. 5.

When data is compressed as shown in FIG. 5, obtained compressed data is a numeral series of (*, 7), (5,3), (7,9), (3,1), (3,6), and (3,3). Here, * indicates that no value is shown in FIG. 5. On an expansion side, compressed data is inputted in the above order. After amplitude data undergoes multiplication and a linearizing operation, the compressed data is inputted to the expanding section 25. Additionally, amplitude data values themselves of the numeral series are shown in FIG. 6 to readily recognize parts corresponding to FIG. 5. However, actual amplitude values are different from those of FIG. 6 due to multiplication and a linearizing operation.

First, data of a waveform a1 is generated by an interpolating operation from two data values of an amplitude data value "7" and a timing data value "5", which are firstly inputted. Next, data of a waveform a2 is generated from two data values of the above timing data "5" and an amplitude data value "3", which is subsequently inputted, by interpolating operation.

Subsequently, data of a waveform b2 is generated from two data values of the above amplitude data value "3" and a timing data value "7", which is subsequently inputted, by an interpolating operation. Further, data of a waveform b1 is generated from the above timing data value "7", and an amplitude data value "9", which is subsequently inputted, by an interpolating operation. In this manner, data of waveforms c1, c2, d2, d1, e1, and e2 is generated in order by using combinations of successively inputted amplitude data values and timing data values.

The above operation generates digital signals (upper stage of FIG. 6) having continuous waveforms a1, b1, c1, d1, and e1, and digital signals (lower stage of FIG. 6) having continuous waveforms a2, b2, c2, d2, and e2. And then, two digital signals generated thus are added to each other. Thus, digital data is reproduced as shown in FIG. 5 after an offset value is added on the compression side. And then, an offset value is subtracted from the digital data and the digital data is returned to data which swings to both positive and negative sides with amplitude of 0 being provided at the center. Thereafter, an original analog signal is reproduced by performing digital-analog conversion.

Figure 9A:
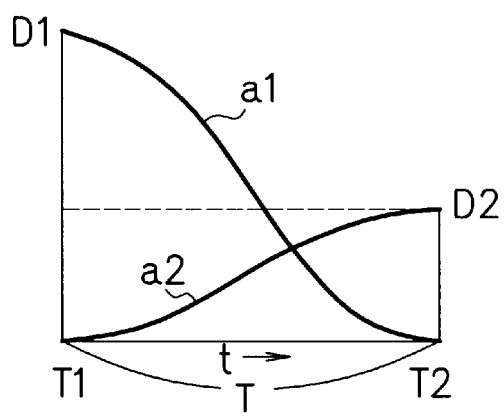
FIGS. 9A and 9B are diagrams showing an interpolating principle of the present embodiment by taking out a section of time T1 to T2 of FIG. 5.
Figure 9B:
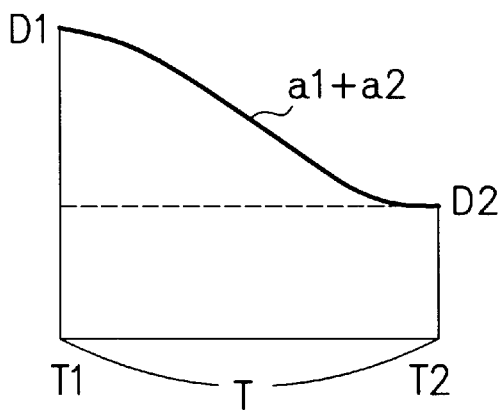

FIGS. 9A and 9B show a section of time T1 and T2 shown in FIG. 6. FIG. 9A shows two waveforms a1 and a2 provided before addition and FIG. 9B shows a synthetic waveform a1+a2 reproduced by addition.

In FIG. 9A, reference numeral D1 denotes an amplitude data value of time T1 ("7" in the example of FIG. 6), reference numeral D2 denotes an amplitude data value of time T2 ("3" in the example of FIG. 6), reference character T denotes a timing data value indicative of a time interval between time T1 and T2 ("5" in the example of FIG. 6), and reference character t denotes arbitrary timing between time T1 and T2.

As shown in FIG. 9A, by using an amplitude data value D1 of the time T1 and a timing data value T indicative of a time interval between the time T1 and T2, data of the waveform a1 is generated by an interpolating operation while arbitrary timing t between time T1 and T2 serves as a variable, namely, while a value of the timing t is incremented by one by one according to a clock based on a sampling frequency.

Further, by using an amplitude data value D2 of the time T2 and a timing data value T indicative of a time interval between time T1 and T2, data of the waveform a2 is generated by an interpolating operation while timing t serves as a variable in the same manner.

Subsequently, data of the waveforms a1 and a2 that is generated thus is added while the timing t serves as a variable. Thus, a waveform is synthesized as shown in FIG. 9B. Operations such as subtraction of an offset value and D/A conversion are further performed on digital data obtained thus. Hence, an original analog signal before compression can be reproduced.

The following will discuss a principle of reproducing an original analog signal by an expanding operation using the above interpolation.

In general, in order to obtain a continuous analog signal from discrete digital data, interpolation is carried out between pieces of digital data inputted in a discrete manner so as to artificially increase a sampling frequency. Normally, such data interpolation is performed using a predetermined sampling function.

Figure 10:
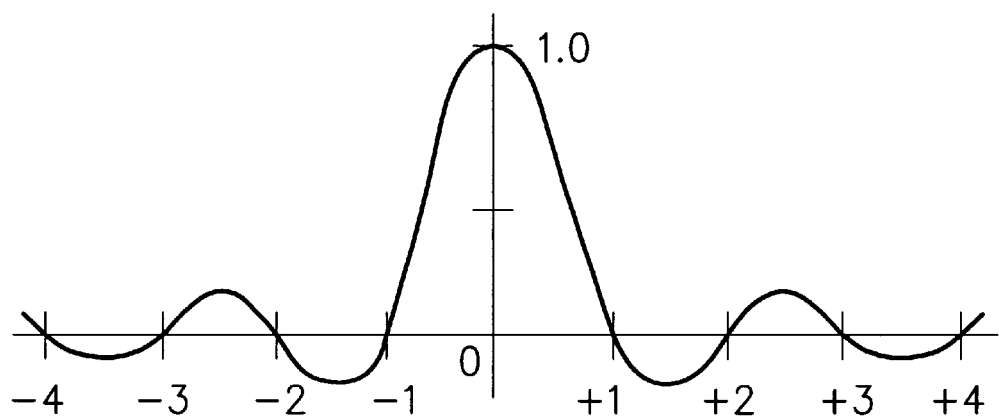
FIG. 10 is a diagram showing an example of a sampling function.

FIG. 10 shows a sinc function as an example of a sampling function. In the example of the sinc function shown in FIG. 10, a value is set at "1" only on a sample point of t=0, and values are all set at "0" on all of the other sample points (t=±1, ±2, ±3, ±4, . . . ) disposed at regular intervals.

FIG. 11 is a diagram for explaining an operation of typical data interpolation using such a sampling function. In FIG. 11, sample points t1, t2, t3, and t4 disposed at regular intervals respectively have discrete data values of Y(t1), Y(t2), Y(t3), and Y(t4). For example, the following will describe the case where an interpolation value y is computed, which corresponds to a predetermined position t0 (distance a from t2) between the sample points t2 and t3.

In general, when an interpolation value y is computed using a sampling function, a value of a sampling function is computed on the interpolating position t0 regarding each piece of given discrete data, and a convoluting operation is carried out using the value. To be specific, each of the sample points t1 to t4 is caused to have an equal peak height at the center of a sampling function. A sampling function value (indicated by x) is computed for each of the sample points at the interpolating position t0, and all the values are added.

Such interpolation is carried out while the interpolating position t0 is moved with the passage of time (in accordance with increment of a timing clock). Thus, an interpolation value y (t0), which varies continuously, is computed in order. Hence, it is possible to obtain a digital waveform for connecting pieces of discrete data more smoothly. A continuous analog signal can be obtained by performing D/A conversion on the digital waveform.

The present embodiment applies such data interpolation. Namely, as shown in FIG. 9A, the waveform a1 is obtained, which forms a part of a sampling function having a value other than "0" on a first sample point (time T1), based on an amplitude data value D1 (=7) and a timing data value T (=5) that have already been inputted in time T2. Further, the waveform a2 is obtained, which forms a part of a sampling function having a value other than "0" on a second sample point (time T2), based on an amplitude data value D2 (=3) and a timing data value T (=5).

The values of the waveforms a1 and a2 are added on an interpolating position t, which is moved with the passage of time. Thus, it is possible to obtain a digital waveform for connecting discrete data D1 and D2 more smoothly. A continuous analog signal can be obtained by performing D/A conversion on the digital waveform after subtraction of an offset value.

Incidentally in the present embodiment, as shown in FIG. 5, discrete data serving as compressed data is obtained on the compression side by sampling digital data at time intervals of points on which differential values vary in polarity. Therefore, the sample points on which discrete data is obtained are not always evenly spaced and the intervals become irregular in many cases (in the example of FIG. 5 as well, the sample points are unevenly spaced in "5,7,3,3,3").

Hence, on the expansion side shown in FIG. 6, for example, when an interpolation value between time T1 and T2 is computed, as shown in FIG. 9, the above convoluting operation is performed by using only sampling functions a1 and a2 at a time interval between the sample points of the time T1 and T2. Other sampling functions b1, b2, c1, c2, d1, d2, e1, and e2 having different time intervals between sample points are not taken into consideration when the convoluting operation is carried out.

Moreover, for example, when an interpolation value is computed between time T2 and T3, a convoluting operation is performed by using only sampling functions b1 and b2 at a time interval (=7) between sample points of time T2 and T3. Other sampling functions a1, a2, c1, c2, d1, d2, e1, and e2 having different time intervals between sample points are not taken into consideration when the convoluting operation is carried out. This holds true when interpolation values are obtained between other sample points.

The following will discuss a specific example of the above data interpolation. As described above, for example, when an interpolation value is obtained between time T1 and T2, only the sampling functions a1 and a2 are used, which are obtained based on amplitude data values in time T1 and T2 and a timing data value indicative of a time interval between time T1 and T2. Namely, data required for computing an interpolation value on each interpolating position t between time T1 and T2 is all obtained at time T2, so that it is possible to reproduce an original digital waveform shown in FIG. 9B at this moment.

Therefore, in the present embodiment, every time two amplitude data values D1 and D2 and a timing data value T indicative of its time interval are obtained for each discrete time of T1 to T6, an interpolation value is computed by using these data values according to an interpolating equation, which will be discussed later. Hence, an original digital waveform is reproduced sequentially. FIG. 12 is a diagram for explaining the interpolating equation.

As shown in FIG. 12, an interpolation value between two sample points having amplitude data values of D1 and D2 can be represented by a function in which two quadratic functions x1 and x2 regarding an interpolating position t are connected at an intermediate point. Namely, in the present embodiment, a part between two sample points is divided into a first half and a second half, and interpolation values thereof are computed using the quadratic functions x1 and x2.

A timing data value T, which is a time interval between the sample points, may be an odd number or an even number. In the case of an odd number, an interpolating position t may not be set at an intermediate point. Therefore, an obtained timing data value may always be set at an even number by performing double oversampling upon compression. In this case, the five timing data values "5,7,3,3,33" of FIG. 5 are transmitted or stored actually as values of "10,14,6,6,6" due to double oversampling. In FIG. 12, a time interval between the sample points is represented by 2T obtained after oversampling.

In FIG. 12, the two quadratic functions x1 and x2 are respectively represented by the following equations.

$$x1=D1+at^2 \quad (1)$$

$$x2=D2-a(t-2T)^2 \quad (2)$$

Moreover, since the functions x1 and x2 are connected at the intermediate point T of the successive sample points, the following equation is established.

$$x1=x2(t=T) \quad (3)$$

Here, when equations (1) and (2) are applied to equation (3), the following equation is established.

$$D1+aT^2=D2-aT^2 \quad (4)$$

When equation (4) is solved for a, the following equation is established.

$$a=-(D1-D2)/2T^2 \quad (5)$$

Therefore, the following equations can be obtained by applying equation (5) to equations (1) and (2).

$$x1=D1-\{(D1-D2)/2T^2\}t^2 \quad (6)$$

$$x2=D2+\{(D1-D2)/2T^2\}(2T-t)^2 \quad (7)$$

Namely, an original digital waveform can be reproduced by performing operations of equations (6) and (7) while an interpolating position t, which is sequentially incremented according to a clock of a sampling frequency doubled from an original frequency, serves as a variable. In the present embodiment, such an interpolating operation is sequentially performed every time a signal line composed of an amplitude data value and a timing data value is inputted for each of discrete time T1 to T6.

Namely, in the example of FIG. 6, when amplitude data values of the samples points in time T1 and T2 and a timing data value therebetween are inputted, an interpolating operation is performed between the sample points so as to immediately reproduce an original digital waveform. Further, an amplitude data value on a sample point in time T3 and a timing data value between the sample points T2 and T3 are inputted, an interpolating operation is performed therebetween so as to immediately reproduce an original digital waveform. The operation is sequentially performed in this manner.

Besides, the interpolating operation represented by the above equations (6) and (7) can be realized by a hardware configuration such as a logic circuit and by DSP (Digital Signal Processor) or software (a program stored in ROM, RAM, and the like).

As specifically described above, according to the present embodiment, it is possible to compress and expand an analog signal or digital data to be compressed as it is on a time base without time/frequency conversion. Hence, the configuration can be simplified without complicated operations. Further, when compressed data is transmitted from the compression side and is reproduced on the expansion side, inputted compressed data can be sequentially processed and reproduced by a simple interpolating operation on a time base, thereby achieving real-time operations.

Additionally, in the present embodiment, signed digital data is converted to unsigned digital data by adding an offset value to the signed digital data, and then, a rounding operation of lower-order bits is carried out. Thus, it is possible to shorten a data length by several bits per word, thereby largely reducing an amount of data. At this moment, regarding all data regions, most of amplitude data to be subjected to a rounding operation is concentrated on a data region around the center but appears less frequently on a data region around an end. Thus, even when lower-order bits are reduced, the quality of reproduced voice is hardly affected on the expansion side.

Also, in the present embodiment, since the nonlinearizing operation is performed prior to the rounding operation, it is possible to ease the influence of the rounding operation and to further reduce the influence on the quality of reproduced voice on the expansion side.

Besides, in the present embodiment, points are detected as sample points, on which digital data undergoing a rounding operation has a differential value varying in polarity, and a pair of an amplitude data value, which is obtained on each of the detected sample points, and a timing data value, which is indicative of a time interval of the sample points, is transmitted or recorded as compressed data. Thus, as compressed data, it is possible to obtain only data on a sample point from data compressed by rounding for each word, thereby achieving a high compressibility.

As described above, according to the present embodiment, it is possible to provide a new compressing and expanding method for realizing both of a high compressibility and improved quality of reproduced data.

Additionally, the present embodiment described the cases where the relationships of an input signal and an output signal are shown in graphs of FIGS. 3 and 8, as examples of a nonlinearizing operation and a linearizing operation. The operations are not limited to the above relationships. In other words, other forms of graphs are applicable as long as the operation is performed on some of all data regions indicating the number of bits of amplitude data. For example, a graph is also applicable in which the relationship of an input signal and an output signal Is indicated by a curve.

Further, the present embodiment showed an example in which an amplitude data value is rounded at 256 or 512 in the rounding section 5. The operation is not limited to the above.

Moreover, in the present embodiment, when two or more points appear successively with a differential value of 0 on the compression side, the positions on both ends are detected as sample points, data values of the sample points on both ends are obtained as amplitude data, and a time interval between both ends is obtained as timing data. The operation is not limited to the above. For example, when two or more points successively appear with a differential value of 0, 0 may be used as timing data and the number of successive differential values 0 may be obtained as amplitude data. 0 is not used as a value of timing data under normal conditions. In this case, in the operation for generating interpolation data on the expansion side, monitoring is performed if a value of inputted timing data is 0 or not. When a value is 0, interpolation data with constant amplitude is generated according to the number of clocks of values indicated by amplitude data.

Embodiment 2

The following will discuss Embodiment 2 of the present invention.

In Embodiment 2, in a compressing device, in a step before compressed data (amplitude data and timing data) is generated by at least a timing synthesizer 6 and a compressing section 7, n-times oversampling and a moving average operation or a convoluting operation (hereinafter, referred to as convolution) are performed on supplied digital data so as to obtain smoother data in which pieces of discrete data are connected by interpolation.

Figure 13:
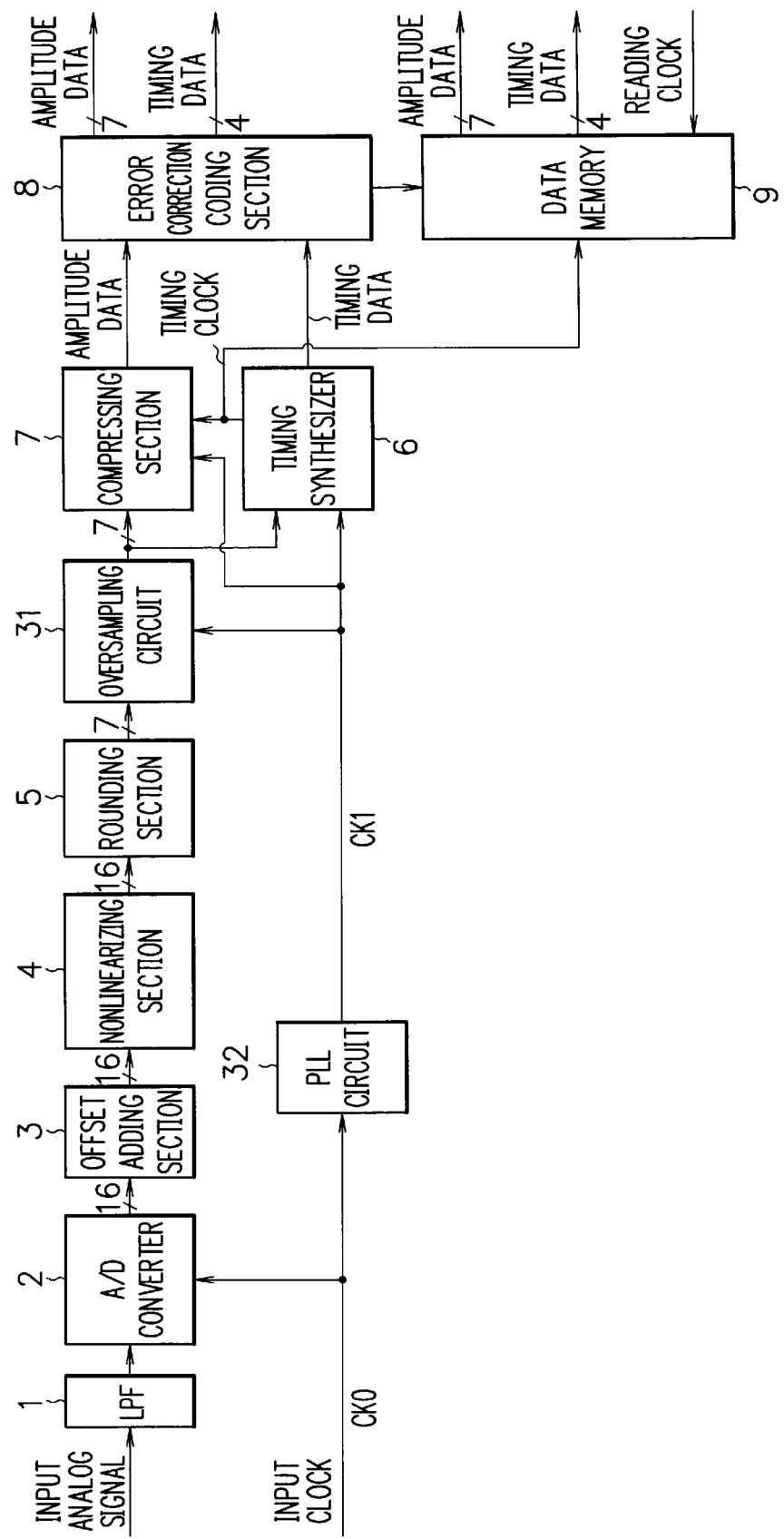
FIG. 13 is a block diagram showing an example of the configuration of a compressing device according to Embodiment 2.

FIG. 13 is a block diagram showing an example of the entire configuration of the compressing device according to Embodiment 2. As shown in FIG. 13, in the compressing device of Embodiment 2, an oversampling circuit 31 and a PLL (Phase Locked Loop) 32 are added to the compressing device of Embodiment 1 shown in FIG. 1.

The oversampling circuit 31 is provided on a subsequent stage of a rounding section 5 and performs n-times oversampling and convolution on digital data, which is inputted from the rounding section 5, so as to compute a digital interpolation value connecting pieces of discrete data. For example, the oversampling circuit 31 inputs voice data sampled at a frequency of 44.1 KHz, performs oversampling on the data at an eight-times frequency (352.8 KHz), and performs convolution. And then, the oversampling circuit 31 outputs a series of oversampled data obtained thus to the timing synthesizer 6 and the compressing section 7.

As sample points, the timing synthesizer 6 and the compressing section 7 detect points on which differential values vary in polarity, from a series of oversampled data supplied from the oversampling circuit 31. And then, a pair of an amplitude data value on each of the detected sample points and a timing data value indicative of a time interval of the sample points is outputted to an error correction coding section 8. The timing synthesizer 6 also obtains a timing clock indicative of timing of a detected point of each of the sample points and outputs the timing clock to the compressing section 7 and a data memory 9.

Further, a PLL circuit 32 generates a clock CK1 having an eight-times frequency (352.8 KHz) from an input clock CK0 having a reference frequency (e.g., 44.1 KHz) and supplies the clock CK1 to the timing synthesizer 6, the compressing section 7, the error correction coding section 8, the data memory 9, and so on as well as the above oversampling circuit 31. The oversampling circuit 31, the timing synthesizer 6, the compressing section 7, the error correction coding section 8, and the data memory 9 operate in synchronization with the clock CK1 having an eight-times frequency.

Figure 14:
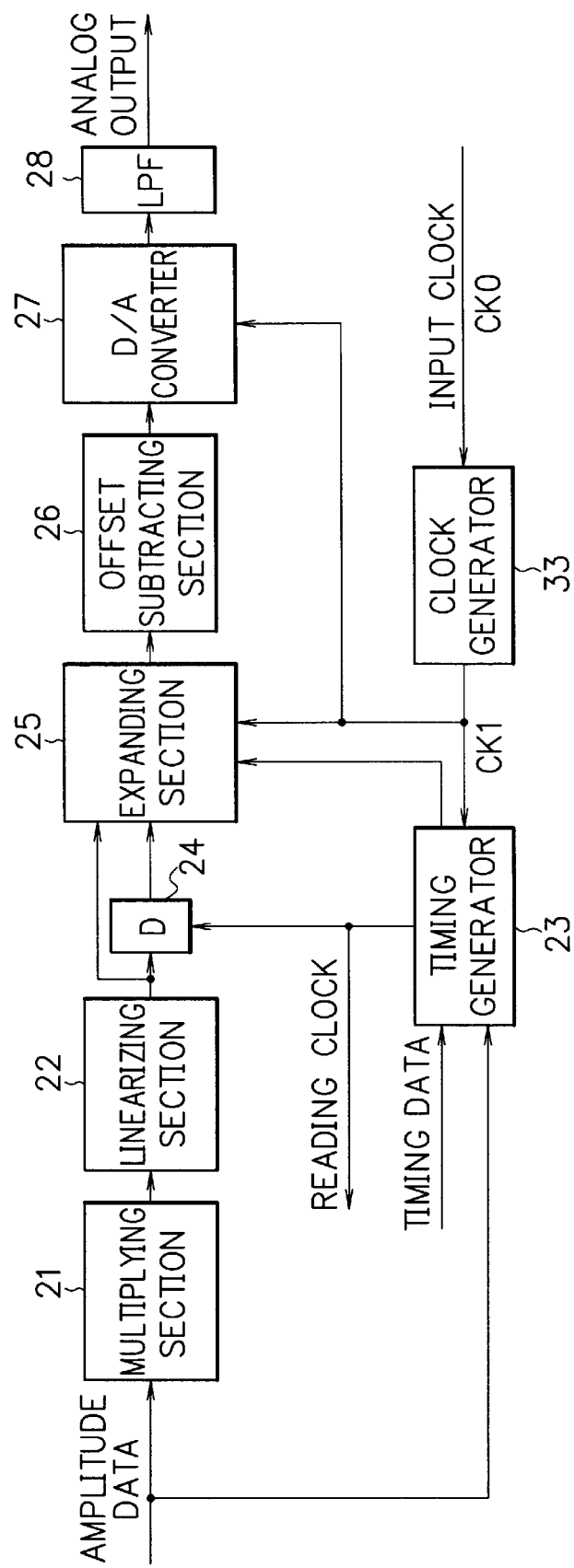
FIG. 14 is a block diagram showing an example of the configuration of an expanding device according to Embodiment 2.

Moreover, FIG. 14 is a block diagram showing an example of the entire configuration of an expanding device according to Embodiment 2. As shown in FIG. 14, in the expanding device of Embodiment 2, a clock generator 33 is added to the expanding device of Embodiment 1 shown in FIG. 7.

The clock generator 33 generates a clock CK1 having an eight-times frequency from an input clock CK0 having a reference frequency and supplies the clock CK1 to a timing generator 23, an expanding section 25, and a D/A converter 27.

And then, the following will discuss in detail the configuration and the operations of the oversampling circuit 31 in the compressing device shown in FIG. 13.

In the oversampling circuit 31 of the present embodiment, when an interpolation value is computed between two pieces of discrete data, each piece of digital data of a basic waveform undergoes oversampling. The waveform has amplitudes corresponding to n pieces of discrete data values that include the two pieces of discrete data. Further, the obtained n pieces of data are synthesized with one another by convolution so as to digitally compute an interpolation value connecting the two pieces of discrete data.

Figure 15:
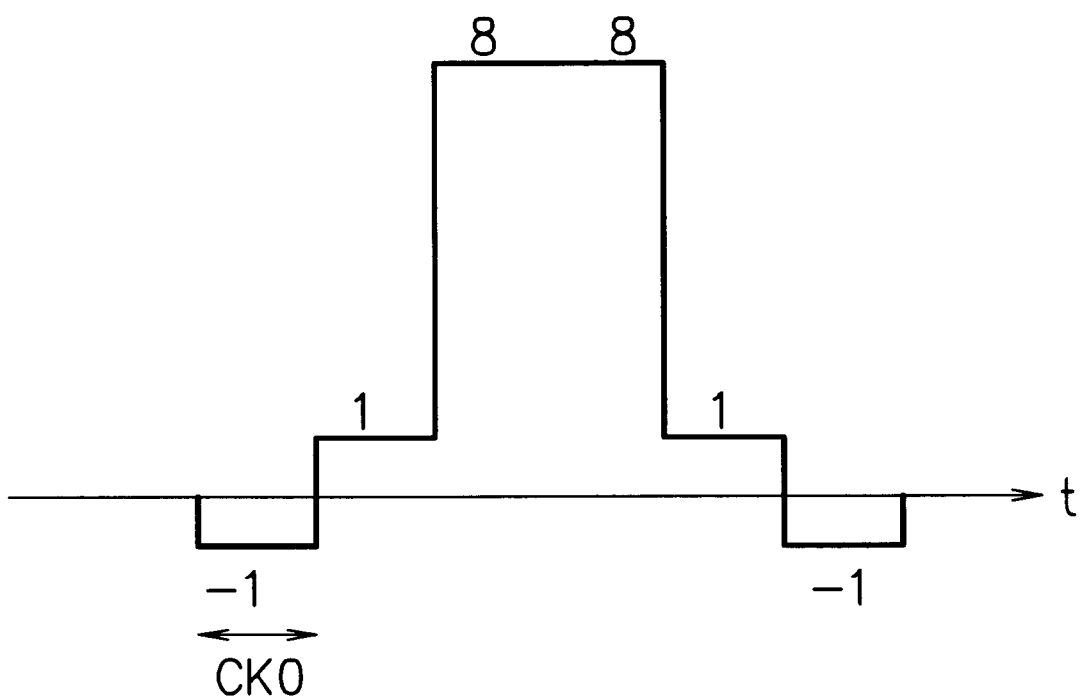
FIG. 15 is a diagram showing a digital basic waveform used in Embodiment 2.

FIG. 15 is an explanatory drawing showing a digital basic waveform used in the present embodiment. The digital basic waveform of FIG. 15 is a basic sampling function, which is used when data is interpolated by oversampling. The digital basic waveform is formed by changing a data value to −1, 1, 8, 8, 1, and −1 for each clock (CK0) of a reference frequency.

Referring to FIG. 16, the following will discuss a principle of data interpolation according to the present embodiment, by taking as an example the case where an interpolation value is generated by n-times oversampling and convolution from discrete data values (−1, 1, 8, 8, 1, −1)/8, which correspond to a normalized digital basic waveform shown in FIG. 15. Besides, in consideration of a space of the figure, FIG. 16 shows an example of four-times oversampling. The oversampling circuit 31 of FIG. 13 actually performs eight-times oversampling.

In FIG. 16, a numeral series shown on the leftmost side indicates values obtained by performing four-times oversampling on original discrete data values of (−1, 1, 8, 8, 1, −1)/8. Further, in four numeral series from the leftmost side to the right, the values on the leftmost side are shifted downward one by one. A direction of the numeral series represents a time base in FIG. 16. Shifting a numeral series downward is equivalent to gradual delay of the values on the leftmost side.

Namely, values of the second numeral series from the left indicate values shifted from the values on the leftmost side by a quarter phase of a clock 4CLK, which has a four-times frequency. Moreover, values on the third numeral series from the left indicate values shifted from the values on the second numeral series from the left by a quarter phase of the clock 4CLK, which has a four-times frequency. Values on the fourth numeral series from the left indicate values shifted from the values on the third numeral series from the left by a quarter phase of the clock 4CLK, which has a four-times frequency.

Further, values on the fifth numeral series from the left indicate values obtained by adding values of the first to fourth numeral series for each of the corresponding rows and dividing the added values by four. The operations on the first to fifth numeral series from the left can digitally perform four-times oversampling together with four-phase convolution.

Values of four numeral series from the fifth numeral series to the right (fifth to eighth numeral series from the left) indicate values shifted downward one by one from values of the fifth numeral series. Also, values on the ninth numeral series from the left indicate values obtained by adding values of the fifth to eighth numeral series for each of the corresponding rows and dividing the added values by four. The operations on the first to ninth numeral series from the left can digitally perform four-times oversampling twice together with four-phase convolution.

Further, values of the tenth numeral series from the left are shifted downward by one from values of the ninth numeral series. Besides, values of the eleventh numeral series (on the rightmost side) from the left are values obtained by adding values of the ninth numeral series and the tenth numeral series for each corresponding row and dividing the added values by two. The values on the rightmost side are target interpolation values.

Figure 17:
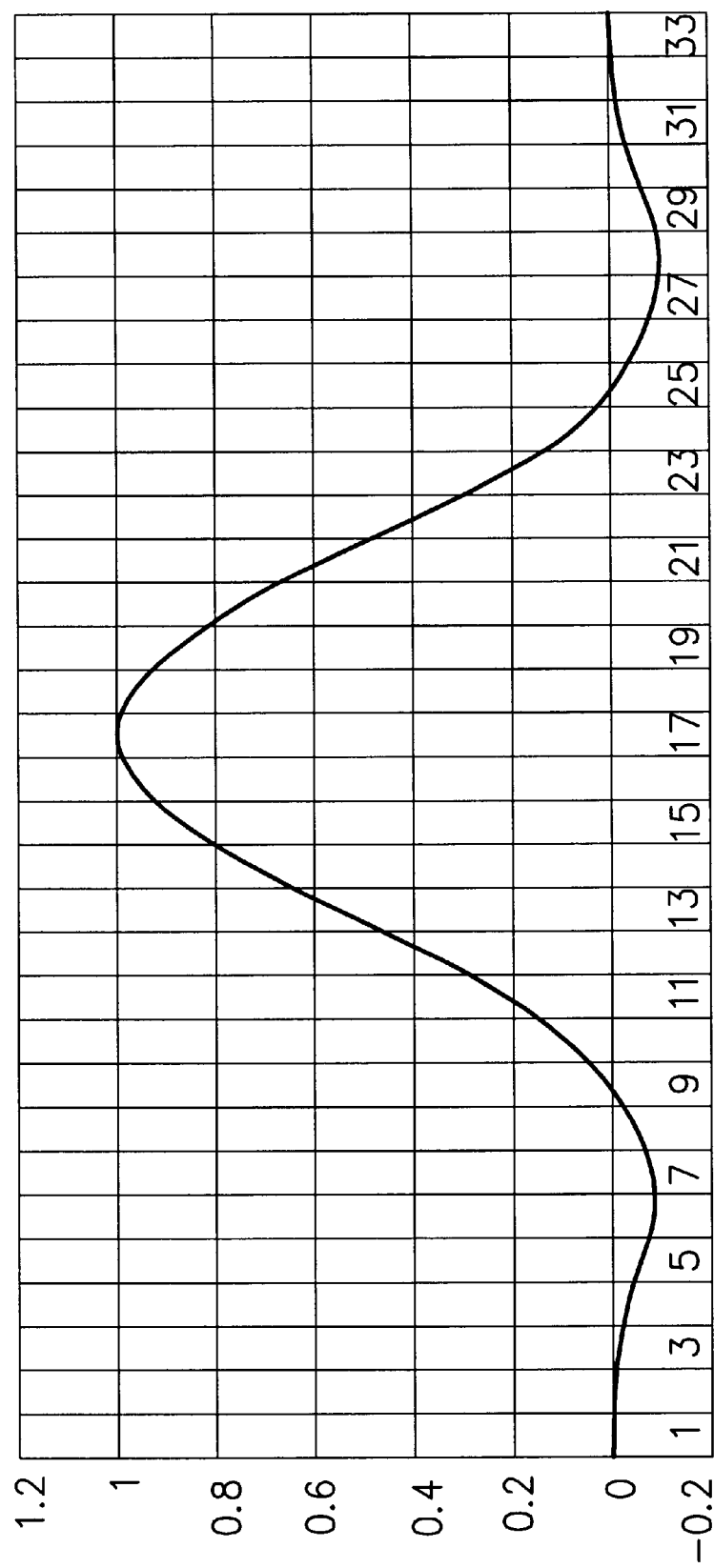
FIG. 17 is a diagram showing a function generated from the digital basic waveform of FIG. 15.

The finally obtained values on the rightmost side of FIG. 16 are shown in a graph of FIG. 17. A function having a waveform of FIG. 17 can be differentiated for one time throughout the range. The function has a limited value other than 0 when a sample position t along a lateral axis is 1 to 33, and values of the function are all set at 0 in other regions.

When the function has a limited value other than 0 on a local region and has 0 in other regions, the state is referred to as a "definite base".

Also, the function of FIG. 17 is a sampling function characterized by having a maximum value only on a sample point of t=17 and a value of 0 on four sample points of t=1, 9, 25, 33. The function passes through all sample points required for obtaining data having a smooth waveform.

As described above, the function of FIG. 17 is a sampling function and differentiation is possible for one time throughout the region. Additionally, the function is a function of a definite base for converging to 0 on a sample point of t=1, 33. Therefore, since superposition is made by using the sampling function of FIG. 17 based on each piece of discrete data, it is possible to interpolate a value between pieces of discrete data by using the function which can be differentiated for one time.

The sinc function of FIG. 10 that is generally used for data interpolation is a function converging to 0 on a sample point of t=±?. Thus, when an interpolation value is computed accurately, it is necessary to calculate a value of the sinc function on an interpolating position for each piece of discrete data until t=±? and to perform a convoluting operation using the value. In contrast, the sampling function of FIG. 17 used in the present embodiment converges to 0 on a sample point of t=1, 33. Hence, only discrete data within a range of t=1 to 33 needs to be considered.

Therefore, when a certain interpolation value is obtained, only values of limited n pieces of discrete data need to be considered, thereby largely reducing a processing quantity. Additionally, discrete data beyond the range of t=1 to 33 is ignored. This is not because a processing quantity, accuracy, and so on need to be considered despite of the fundamental need for considering the discrete data, but because the discrete data does not need to be considered theoretically. Thus, a censoring error does not occur. Therefore, it is possible to accurately obtain an interpolation value by using the method of interpolating data of the present embodiment and to improve the reproducibility of original data before compression, regarding data reproduced on the expansion side when compression is performed using the accurate interpolation value.

FIG. 18 is a block diagram showing an example of the configuration of the oversampling circuit 31 shown in FIG. 13.

As shown in FIG. 18, the oversampling circuit 31 of the present embodiment is constituted by a normalized data memory 41, a phase shifting section 42, a plurality of digital multipliers 43a to 43d, and a plurality of digital adders 44a to 44c. Besides, a PLL circuit 32 of FIG. 18 is identical to that of FIG. 13.

The normalized data memory 41 shifts a series of normalized data in four phases and stores the data as shown on the rightmost side of FIG. 16. Additionally, FIG. 16 shows an example in which four-times oversampling is performed on the digital basic waveform of FIG. 15. Meanwhile, since the oversampling circuit 31 of FIG. 13 performs eight-times oversampling, in the normalized data memory 41, a digital basic waveform undergoes eight-times oversampling and a series of data normalized by convolution is stored. Four-phase normalized data stored in the normalized data memory 41 is read in response to clocks CK0 and CK1 supplied from the PLL circuit 32, and the data of each phase is supplied to one of the input terminals of each of the four digital multipliers 43a to 43d.

Moreover, the phase shifting section 42 performs a phase shifting operation for shifting the phase of discrete data, which is inputted as data to be compressed, to four phases. Four-phase discrete data generated by the phase shifting section 42 is outputted in response to the clocks CK0 and CK1 supplied from the PLL circuit 32, and the data of each phase is supplied to the other input terminal of each of the four digital multipliers 43a to 43d.

The four digital multipliers 43a to 43d multiply four-phase normalized data, which is outputted from the normalized data memory 41, and four-phase discrete data, which is outputted from the phase shifting section 42. The three digital adders 44a to 44c, which are connected to the subsequent stage of the multipliers, add all the multiplication results of the four digital multipliers 43a to 43d and output the result of the addition to the timing synthesizer 6 and the compressing section 7 of FIG. 13.

As shown in the configuration of FIG. 18, in the present embodiment, the normalized data memory 41 such as ROM stores in advance normalized data on the rightmost side. The normalized data is obtained by convolution of FIG. 16. And then, the normalized data is modulated to amplitude corresponding to a value of discrete data inputted as data to be compressed. The obtained data is synthesized by four-phase convolution and is outputted.

An amplitude value of discrete data, which is inputted as data to be compressed, may be multiplied relative to the digital basic waveform of FIG. 15, and convolution of FIG. 16 may be performed on an obtained data value during compression. In the case of the oversampling circuit 31 configured as PIG. 18, it is not necessary to perform convolution of FIG. 16 during actual compression, thereby increasing a compressing speed.

As specifically described above, in Embodiment 2, oversampling and convolution are performed on inputted discrete digital data on the compression side to generate continuous data having a smooth change, and discrete amplitude data values and timing data values indicative of irregular time intervals are obtained as compressed data from the obtained oversampled data.

In this case, when a function is generated from the digital basic waveform when oversampling and convolution are performed, the function is a sampling function of a definite base for converging values to 0 on a limited sample position, and differentiation is possible for one time. Therefore, when a certain interpolation value is computed, only a limited number of discrete data values need to be considered, thereby largely reducing a processing quantity. Besides, since a censoring error does not occur, it is possible to obtain an accurate interpolation value and to improve the reproducibility of original data before compression, regarding data reproduced on the expansion side when compression is performed using the interpolation value.

Therefore, according to Embodiment 2, while maintaining a compressibility as high as that of Embodiment 1, it is possible to further improve the quality of reproduced data obtained by expanding compressed data.

Additionally, in Embodiment 2, although the oversampling circuit 31 is provided on the subsequent stage of the rounding section 5, the configuration is not limited to the above. Namely, the oversampling circuit 31 may be provided anywhere between the A/D converter 2 and the compressing section 7. Further, although the oversampling circuit 31 performs eight-times oversampling, the oversampling is not limited to eight times. For example, two times, four times, and the like are applicable.

The above-mentioned compressing and expanding methods of Embodiments 1 and 2 can be realized by any of hardware, DSP, and software. For example, in the case of software, the compressing device and the expanding device of the present embodiments are actually composed of a CPU or MPU, RAM, ROM, and soon of a computer, and the methods are realized by operating programs stored in RAM and ROM.

Therefore, the methods are realized as follows: programs for operating a computer for achieving the function of the present embodiments are stored in a recording medium such as a CD-ROM, and the programs are read by the computer. As a recording medium for recording such programs, a floppy disk, a hard disk, a magnetic tape, a magneto-optical disk, a nonvolatile memory card, and so on are applicable in addition to a CD-ROM.

Further, in addition to the case where the computer runs supplied programs to achieve the function of the above embodiments, the embodiments of the present invention also include the programs used in the case where the programs realize the function of the above embodiments in coordination with OS (operating system), which operates in the computer, or other application software and the like, and the case where all or some of the operations of the supplied programs are performed by a function extended board and a function extended unit of the computer to achieve the function of the above embodiments.

Additionally, each of the above-mentioned embodiments merely shows an example of the present invention. It should be understood that there is no intention to limit the invention to the specific forms disclosed. Namely, the present invention is to cover various forms within the spirit or major characteristics of the invention.

Industrial Applicability

The present invention is useful for realizing both of a high compressibility and improved quality of reproduced data with a simple configuration and a shorter compressing and expanding time.

What is claimed is:

1. A compressing method characterized in that signed digital data is converted to unsigned digital data by adding an offset value to signed digital data obtained by performing D/A conversion on inputted signed digital data or an inputted analog signal, after a rounding operation of a lower-order bit is performed on said unsigned digital data, said rounded digital data is sampled at a time interval of a point where a differential value varies in polarity, and a pair of discrete amplitude data on each sample point and timing data indicative of a time interval between sample points is obtained as compressed data.

2. The compressing method according to claim 1, characterized in that regarding unsigned digital data generated by adding said offset value, a data value is changed by performing a different operation for each value and is outputted.

3. The compressing method according to claim 2, characterized in that an input data value is multiplied and outputted on some of all data regions represented by the number of bits of said unsigned digital data.

4. The compressing method according to claim 1, characterized in that when a time interval between said sample points exceeds a value represented by the number of bits assigned to said timing data, a timing interval between said sample points is represented by the sum of a plurality of timing data values.

5. The compressing method according to claim 1, characterized in that digital data to be compressed undergoes oversampling at least before said differential value is computed, and a pair of said amplitude data and timing data is obtained as compressed data by using oversampled data generated thus.

6. The compressing method according to claim 1, characterized in that at least before said differential value is computed, a digital interpolation value for said discrete data is computed by synthesizing digital data, which has a basic waveform corresponding to values of n pieces of inputted discrete data, by oversampling and a moving average operation or a convoluting operation, and a pair of said amplitude data and timing data is obtained as compressed data by using said oversampled data generated thus.

7. A compressing device, comprising:
offset adding means for converting signed digital data to unsigned digital data by adding an offset value to signed digital data;
rounding means for rounding a lower-order bit of unsigned digital data generated by said offset adding means; and
compressed data generating means for sampling digital data generated by said rounding means at a time interval of a point where a differential value varies in polarity and for obtaining as compressed data a pair of discrete amplitude data on each sample point and timing data indicative of a time interval between sample points.

8. The compressing device according to claim 7, further comprising nonlinearizing means for outputting to said rounding means unsigned digital data inputted from said offset adding means, after a data value is changed by performing a different operation for each value, so that the relationship of an input data value and an output data value is shifted from a one-to-one relationship.

9. The compressing device according to claim 8, characterized in that said nonlinearizing means multiplies and outputs an input data value on some of all data regions represented by the number of bits of said unsigned digital data to be inputted.

10. The compressing device according to claim 7, characterized in that when a time interval between said sample points exceeds a value represented by the number of bits assigned to said timing data, in said compressed data generating means, a time interval between said sample points is represented by the sum of a plurality of timing data values.

11. The compressing device according to claim 7, further comprising oversampling means for performing oversampling on digital data by using a clock having a frequency of an integral multiple,
characterized in that a pair of said amplitude data and timing data is obtained as compressed data based on digital data generated by said oversampling means.

12. The compressing device according to claim 7, further comprising oversampling means for computing a digital interpolation value for said discrete data by synthesizing digital data, which has a basic waveform corresponding to values of n pieces of inputted discrete data, by oversampling and a moving average operation or a convoluting operation,
characterized in that a pair of said amplitude data and timing data is obtained as compressed data based on digital data generated by said oversampling means.

13. An expanding method characterized in that regarding compressed data including a pair of amplitude data, which is extracted from data to be compressed on a predetermined sample point, and timing data indicative of a time interval between sample points, a value of amplitude data on each sample point is multiplied by the number of bits rounded on a compression side, after interpolation data for interpolating amplitude data having a time interval indicated by said timing data is obtained by using amplitude data obtained thus on each sample point and timing data between said sample points, and an offset value equal to a value added on a compression side is subtracted from said interpolation data so as to obtain expanded data including signed digital data.

14. The expanding method according to claim 13, characterized in that regarding digital data generated by said multiplying operation, a data value is changed by performing a different operation for each value and is outputted.

15. The expanding method according to claim 14, characterized in that an input data value is divided by more than one and outputted on some of all data regions represented by the number of bits of said multiplied digital data.

16. An expanding device, comprising:
multiplying means for multiplying an amplitude data value on each sample point by the number of bits rounded on a compression side, regarding compressed data including a pair of amplitude data, which is extracted from data to be compressed on a predetermined sample point, and timing data indicative of a time interval between sample points;
expanding means for obtaining interpolation data, which interpolates amplitude data having a time interval represented by said timing data, by using amplitude data generated by said multiplying means on each sample point and timing data between sample points; and
offset subtracting means for obtaining expanded data including signed digital data by subtracting an offset value equal to a value added on a compression side from interpolation data obtained by said expanding means.

17. The expanding device according to claim 16, further comprising linearizing means for outputting to said expanding means amplitude data inputted from said multiplying means, after a data value is changed by performing a different operation for each value, so that the relationship of an input data value and an output data value is returned to a one-to-one relationship.

18. The expanding device according to claim 17, characterized in that in said linearizing means, an input data value is divided by more than one and outputted on some of all data regions represented by the number of bits of said inputted amplitude data.

19. A compressing and expanding system characterized in that on a compression side, signed digital data to be compressed is converted to unsigned digital data by adding an offset value to signed digital data, after a rounding operation of a lower-order bit is performed on said unsigned digital data, said digital data undergoing said rounding operation is sampled at a time interval of a point where a differential value varies in polarity, and a pair of a discrete amplitude data value on each sample point and a timing data value indicative of a time interval between sample points is obtained as compressed data; and
on an expansion side, after an amplitude data value included in said compressed data is multiplied by the number of bits rounded on a compression side, said amplitude data is reproduced by using an amplitude data value obtained thus and a timing data value included in said compressed data so as to have a timing interval indicated by said timing data, interpolation data for interpolating two pieces of amplitude data is generated based on two pieces of amplitude data on successive two sample points and timing data between said sample points, and an offset value equal to that of the compression side is subtracted from generated interpolation data so as to obtain expanded data.

20. The compressing and expanding system according to claim 19, characterized in that on a compression side, unsigned digital data generated by adding said offset value is subjected to said rounding operation after a data value is changed by performing a different operation for each value, and
on an expansion side, amplitude data generated by said multiplying operation is subjected to an operation for generating said interpolation data after a data value is changed by performing a different operation for each value.

21. The compressing and expanding system according to claim 19, characterized in that when a time interval between said sample points exceeds a value represented by the number of bits assigned to said timing data, a time interval between said sample points is represented by the sum of a plurality of timing data values.

22. The compressing and expanding system according to claim 19, characterized in that on a compression side, a digital interpolation value for said discrete data is computed by synthesizing digital data, which has a basic waveform corresponding to values of n pieces of inputted discrete data, by oversampling and a moving average operation or a convoluting operation, and a pair of said amplitude data and timing data is obtained as compressed data based on said oversampled data.

23. A recording medium being capable of computer reading, characterized by recording a program for causing a computer to carry out the steps of said compressing method according to claim 1.

24. A recording medium being capable of computer reading, characterized by recording a program for causing a computer to carry out the steps of said expanding method according to claim 13.

25. A recording medium being capable of computer reading, characterized by recording a program for causing a computer to function as said means according to claim 7.

26. A recording medium being capable of computer reading, characterized by recording a program for causing a computer to function as said means according to claim 16.

27. A recording medium being capable of computer reading, characterized by recording a program for causing a computer to realize the function of said compressing and expanding system according to claim 19.

* * * * *